(12) United States Patent
Shanan

(10) Patent No.: US 8,970,315 B2
(45) Date of Patent: Mar. 3, 2015

(54) LOW NOISE OSCILLATOR HAVING PASSIVE IMPEDANCE NETWORK

(75) Inventor: Hyman Shanan, Franklin Park, NJ (US)

(73) Assignee: Analog Devices, Inc., Norwood, MA (US)

( * ) Notice: Subject to any disclaimer, the term of this patent is extended or adjusted under 35 U.S.C. 154(b) by 53 days.

(21) Appl. No.: 13/598,429

(22) Filed: Aug. 29, 2012

(65) Prior Publication Data
US 2013/0082788 A1    Apr. 4, 2013

Related U.S. Application Data

(60) Provisional application No. 61/533,085, filed on Sep. 9, 2011.

(51) Int. Cl.
*H03B 5/12* (2006.01)
*H03B 1/04* (2006.01)

(52) U.S. Cl.
CPC ............... *H03B 1/04* (2013.01); *H03B 5/1265* (2013.01); *H03B 2201/0258* (2013.01); *H03B 2201/0266* (2013.01); *H03B 2200/005* (2013.01); *H03B 2200/0062* (2013.01); *H03B 5/1228* (2013.01); *H03B 5/1215* (2013.01); *H03B 5/1243* (2013.01); *H03B 2200/009* (2013.01); *H03B 2202/03* (2013.01)
USPC .................................................. 331/117 FE

(58) Field of Classification Search
CPC .. H03B 5/1265; H03B 5/1253; H03B 5/1237; H03B 5/1228; H03B 5/1212; H03B 5/1215; H03B 5/02; H03B 2201/0258; H03B 2201/0266; H03B 2202/02; H03B 2202/027; H03B 1/04; H03B 1/00

USPC ............. 331/117 R, 117 FE, 167, 179, 177 V
See application file for complete search history.

(56) References Cited

U.S. PATENT DOCUMENTS

| | | | |
|---|---|---|---|
| 6,147,567 A | 11/2000 | Welland et al. | |
| 6,927,643 B2 * | 8/2005 | Lazarescu et al. | 331/186 |
| 7,002,393 B2 | 2/2006 | Yeh | |
| 7,084,713 B2 | 8/2006 | Peluso | |
| 7,116,183 B2 | 10/2006 | Wu | |

(Continued)

OTHER PUBLICATIONS

Andreani et al. "Tail current noise suppression in RF CMOS VCOs." Solid-State Circuits, IEEE Journal of 37.3 (2002): 342-348.*

(Continued)

*Primary Examiner* — Ryan Johnson
(74) *Attorney, Agent, or Firm* — Knobbe, Martens, Olson & Bear, LLP

(57) ABSTRACT

Apparatus and methods are disclosed related to an oscillator that includes a sustaining amplifier. One such apparatus includes a resonant circuit configured to operate at a resonant frequency, a sustaining amplifier, and a passive impedance network. The resonant circuit can have a first terminal and a second terminal. The sustaining amplifier can include at least a first switch configured to drive the first terminal of the resonant circuit in response to an input at a first control terminal of the first switch. The passive impedance network can be configured to pass a bias to the first control terminal, such as a gate of a field effect transistor, of the first switch. The passive impedance network can be electrically coupled to the second terminal of the resonant circuit and can include at least one inductor.

21 Claims, 15 Drawing Sheets

(56) References Cited

U.S. PATENT DOCUMENTS

| | | |
|---|---|---|
| 7,253,693 B2 | 8/2007 | Zhang et al. |
| 7,679,465 B2 * | 3/2010 | Aspemyr et al. ........ 331/117 FE |
| 7,688,153 B2 * | 3/2010 | Jacobsson et al. ...... 331/117 FE |
| 8,044,741 B2 * | 10/2011 | Barton et al. ............. 331/177 V |
| 8,193,868 B2 | 6/2012 | Trivedi |
| 2008/0157877 A1 | 7/2008 | Feng et al. |
| 2008/0174378 A1 | 7/2008 | Cusmai et al. |
| 2009/0184771 A1 | 7/2009 | Barton et al. |
| 2012/0001699 A1 * | 1/2012 | Yang et al. .............. 331/117 FE |
| 2013/0063219 A1 | 3/2013 | Shanan |

OTHER PUBLICATIONS

Cignani et al., "Circuit Architectures for Low-Phase-Noise Oscillators", *2002 GaAs Symposium*, pp. 77-80, Milano, Italy (Sep. 23-27, 2002).

Chang et al., "Phase Noise in Coupled Oscillators: Theory and Experiment", *IEEE Transactions on Microwave Theory and Techniques*, vol. 45, No. 5, pp. 604-615 (May 1997).

Florian et al., "Push-Push X Band GaInP/GaAs VCO with a Fully Monolithic Microstrip Resonator", *IEEE MTT-S Digest*, pp. 1999-2002 (2004).

Gris, Marco, "Wideband Low Phase Noise Push-Push VCO", *Applied Microwave & Wireless*, pp. 28-32 (Jan. 2000).

Reddy et al., "Tuned LC Clock Buffers with Static Phase Adjust", *IEEE Radio Frequency Integrated Circuits Symposium*, pp. 519-522 (2007).

Yabuki et al. VCOs for Mobile Communications, Applied Microwave, pp. 51-59, Winter 1991-1992. Retrieved on Aug. 28, 2013 from: http://www.am1.us/Protected_Papers/U11624_VCOs_for_Mobil_Comm-Yabuki.pdf.

U.S. Appl. No. 13/464,522, filed May 4, 2012.

U.S. Appl. No. 13/464,541, filed May 4, 2012.

* cited by examiner

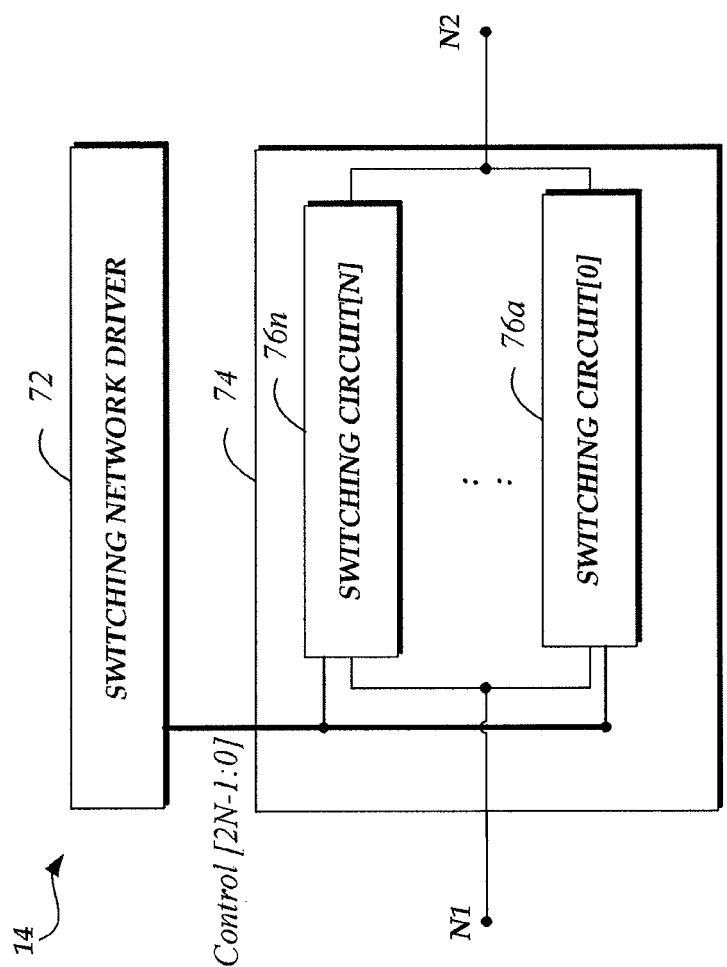

LOW NOISE OSCILLATOR HAVING PASSIVE IMPEDANCE NETWORK

CROSS-REFERENCE TO RELATED APPLICATIONS

This application claims the benefit of U.S. Provisional Patent Application No. 61/533,085, filed Sep. 9, 2011, titled LOW NOISE OSCILLATOR, the disclosure of which is hereby incorporated by reference in its entirety herein.

This application is related to U.S. patent application Ser. No. 13/598,426, filed on even date herewith, titled LOW NOISE OSCILLATOR HAVING SWITCHING NETWORK, the disclosure of which is hereby incorporated by reference in its entirety herein.

TECHNICAL FIELD

The invention relates to electronics, and, more particularly, to circuits configured to oscillate.

DESCRIPTION OF THE RELATED TECHNOLOGY

Electronic systems, such as transceivers that include a synthesizer, can include an oscillator. In some applications, an oscillator can be used for modulation and/or demodulation in a transceiver. In other applications, an oscillator can be used for a clock and data recovery circuit and/or in a phase-locked loop. A number of oscillators can generate a relatively high frequency output signal, which can be desirable for various wired and wireless applications. An LC resonator-based oscillator is one type of oscillator that can generate a relatively high frequency output.

Noise from an oscillator can impact the performance of an electronic system, such as a transceiver. One type of noise in an oscillator is phase noise. Phase noise can be a frequency domain representation of short-term fluctuations in a phase of a waveform caused by time domain instabilities. Phase noise can represent a power spectral density of a phase of a signal and/or the power spectral density of the signal. Numerous attempts have been made to reduce the phase noise of oscillators, such as LC oscillators. However, noise issues persist in oscillators. For example, some transceivers and/or components of transceivers have stringent noise requirements that can be difficult to meet due to phase noise generated by LC oscillators. Because noise issues can impact the performance of electronic systems, better noise performance of a part can contribute to commercial success of the part and/or electronic system. Accordingly, there is a need for low noise oscillators.

SUMMARY OF CERTAIN INVENTIVE ASPECTS

In one embodiment, an apparatus includes a resonant circuit having a first terminal and a second terminal, a sustaining amplifier, and a passive impedance network. The resonant circuit is configured to operate at a resonant frequency. The sustaining amplifier includes a first switch configured to drive the first terminal of the resonant circuit in response to an input at a first control terminal of the first switch. The passive impedance network includes one or more explicit passive impedance elements. The one or more explicit passive impedance elements include at least one inductor. The passive impedance network is electrically coupled to the second terminal of the resonant circuit. The passive impedance network is configured to pass a bias to the first control terminal of the first switch.

In another embodiment, a method of reducing phase noise in an oscillator having a resonant circuit with an inverted node and a non-inverted node is provided. The method includes blocking a DC bias to a first gate of a first transistor of a sustaining amplifier via a passive impedance network. The passive impedance network includes one or more explicit passive impedance elements. The first transistor is configured to drive the non-inverted node of the resonant circuit of the oscillator. The method also includes biasing the first gate of a first transistor at least in part via an inductor of the passive impedance network.

In another embodiment, an apparatus includes a resonant circuit having a first end and a second end, a sustaining amplifier, and a passive impedance network. The sustaining amplifier includes a first switch configured to drive the first end of the resonant circuit in response to an input at a first control terminal of the first switch. The passive impedance network includes one or more explicit passive impedance elements. The one or more explicit passive impedance elements include at least one inductor. The passive impedance network is electrically coupled to the second end of the resonant circuit. The passive impedance network is configured to resonate a capacitance associated with the sustaining amplifier.

In another embodiment, an apparatus includes a resonant circuit having a first terminal and a second terminal. The resonant circuit includes a switching network configured to tune a resonant frequency of the resonant circuit. The switching network includes a first switching circuit. The first switching circuit includes a circuit element having at least a first end electrically coupled to the first terminal of the resonant circuit and a second end, a switch, and an active circuit. The switch is configured to electrically couple the second end of the circuit element to the second terminal when on and not to electrically couple the second end of the circuit element to the second terminal when off. The active circuit is configured to assert a high impedance on an intermediate node between the switch and the second end of the circuit element when the switch is off.

In another embodiment, an apparatus includes a resonant circuit having a non-inverted node and an inverted node. The resonant circuit includes a switching network configured to tune a resonant frequency of the resonant circuit. The switching network includes a circuit element having at least a first end and a second end and a switch. The switch is configured to couple the second end of the circuit element to the inverted node when on and not to couple the second end of the circuit element to the inverted node when off. The switching network also includes one or more circuit elements configured to generate a high impedance on an intermediate node between the switch and the second end of the circuit element when the switch is off, to apply a bias to the intermediate node when the switch is off to maintain the switch in an off position, and to cease generating the high impedance on the intermediate node when the switch is on.

In another embodiment, a method of reducing phase noise in an oscillator is provided. The method includes selectively coupling at least one circuit element to a node of a resonant circuit via activation of a switch in response to a signal applied to a control terminal of the switch for tuning of a frequency of the resonant circuit. The method also includes generating, via an active circuit, a high impedance on an intermediate node between the switch and the at least one circuit element when the switch is off to reduce phase noise of the oscillator. In addition, the method includes applying, via the active circuit a bias to the intermediate node to maintain the switch in the off position.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 7 is a block diagram of a switching network.

DETAILED DESCRIPTION OF CERTAIN EMBODIMENTS

Figure 1:
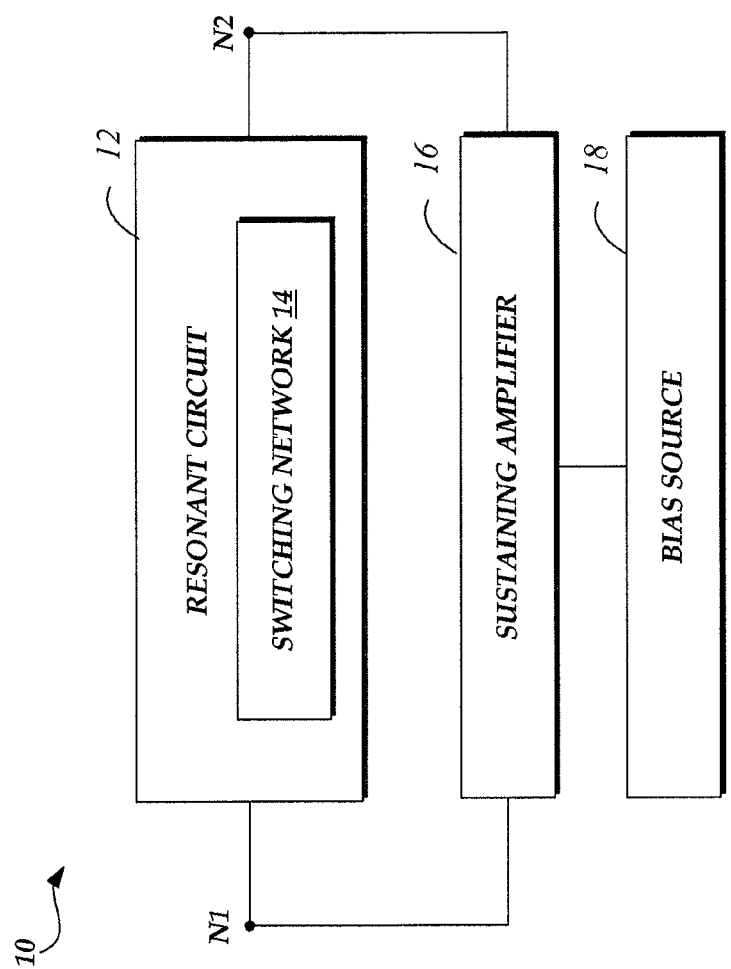
FIG. 1 is a block diagram illustrating an oscillator.

The following detailed description of certain embodiments presents various descriptions of specific embodiments of the inventions. However, the inventions can be embodied in a multitude of different ways as defined and covered by the claims. In this description, reference is made to the drawings where like reference numerals indicate identical or functionally similar elements.

Generally described, aspects of this disclosure relate to low noise oscillators. More specifically, aspects of this disclosure relate to oscillators with low noise in a sustaining amplifier and/or a switching circuit configured to adjust a resonant frequency of the oscillator. Thermal noise current can be reduced in such oscillators, which can result in less phase noise.

It can be desirable for an oscillator to have relatively good noise performance. Noise can impact a number of performance aspects of a communications transceiver or other electronic system. For instance, noise from an oscillator can impact receiver blocking performance in a wireless communications transceiver and/or a transmitter spectral mask. As another example, oscillator noise can also affect jitter performance of a clock and data recovery circuit. Accordingly, there is a need for oscillators with relatively low noise in a wide variety of applications.

A number of emerging wired and wireless applications benefit from operating at relatively high frequencies, such as frequencies in the radio frequency (RF) range. One type of oscillator suitable for such applications is an LC resonator-based oscillator. The apparatus, systems, and methods described herein relate to reducing noise, such as phase noise, of LC resonator-based oscillators and/or noise in other oscillators.

FIG. 1 is a block diagram illustrating an oscillator 10. The oscillator 10 can include one or more of a resonant circuit 12 that can include a switching network 14, a sustaining amplifier 16, and a bias source 18. The oscillator 10 can generate a periodic electronic signal. Such an output of the oscillator 10 can be used in any application with a need for a periodic electronic signal, such as modulating/demodulating a signal and/or a clock and data circuit. In some implementations, the oscillator 10 can be configured to generate a sinusoidal output signal. The oscillator 10 can be a voltage-controlled oscillator (VCO), according to some implementations.

The resonant circuit 12 can be any circuit configured to oscillate to generate a periodic signal. Although some of the description herein relates to an LC tank for illustrative purposes, it will be understood that the principles and advantages described herein can be applied to a number of other resonant circuits including, for example, RC oscillators, Colpitts oscillators, Armstrong oscillators, Pierce oscillators, Clapp oscillators, relaxation oscillators, the like, or any combination thereof.

The resonant circuit 12 can generate a range of output frequencies. More specifically, the switching network 14 can obtain one or more control signals to adjust the output frequency of the oscillator 10. Based on the one or more control signals, the resonant circuit 12 can oscillate at a higher or a lower frequency. In an LC tank implementation of the resonant circuit 12, a resonant frequency ω of the resonant circuit 12 can be proportional to the reciprocal of the square root of the inductance L times the capacitance C, for example, as represented by the Equation 1.

$$\omega = \frac{1}{\sqrt{LC}} \quad \text{(Eq. 1)}$$

The resonant circuit 12 can generate periodic signals at a first node N1 and a second node N2. For example, the voltage at the first node N1 and the second node n2 can be periodic as the resonant circuit 12 oscillates. The signals at the first node N1 and the second node N2 can be sinusoidal signals that are 180 degrees out of phase with each other, in some implementations. For instance, the first node N1 and the second node N2 can have voltages that have opposite signs and approximately the same magnitude at any given time. In other implementations, the first node N1 and the second node N2 can have voltages that have opposite logical values at any given time. In some implementations, the first node N1 and the second node N2 can be referred to as a non-inverted node and an inverted node, respectively, the signals can have values that are inverted from each other.

The resonant circuit 12 can include the switching network 14. The switching network 14 can include one or more circuit elements that can be coupled in parallel and/or series with a resonant portion of the resonant circuit 12 configured to oscillate. This can adjust the resonant frequency ω of the oscillator 10. For example, in an LC tank implementation, the switching network 14 can include one or more capacitive circuit elements that can be coupled in parallel with other capacitive elements of the LC tank via switches, such as field effect transistors. Based on one or more control signals provided to the switches, more or less capacitance can be coupled in parallel with the LC tank. With additional capacitance, the output frequency can decrease. Conversely, with reduced capacitance, the output frequency can increase. Coupling one or more circuit elements across the portion of the resonant circuit 12 configured to oscillate can cause the resonant circuit 12 to oscillate within a selected frequency band.

The sustaining amplifier 16 can compensate for energy losses and/or dissipation in the resonant circuit 12, thereby keeping the resonant circuit 12 oscillating at the resonant frequency ω. For instance, in an LC tank implementation, the sustaining amplifier 16 can include a first transistor configured to drive a first node N1 of the LC tank based on a voltage on a second node N2 of the LC tank and a second transistor configured to drive the second node N2 of the LC tank based on a voltage on the first node N1 of the LC tank.

The sustaining amplifier 16 can be biased by any suitable bias source 18. For instance, the bias source 18 can be a bias current source. The bias source 18 can provide a bias current which can be passed by transistors in the sustaining amplifier 16 to the resonant circuit 12. In some implementations, the bias source 18 can include a transistor configured to pass a voltage from a power rail (e.g., ground for a N-type device and power for a P-type device) based on a bias voltage applied to the transistor, for example, at the gate of a field effect transistor.

Numerous attempts have been made to reduce the phase noise of oscillators, and that of LC oscillators in particular. However, at least two noise sources appear to be unaddressed. These two noise sources include a first noise source due to the active devices of a resonant sustaining amplifier and a second noise source due to a capacitor switching network used to tune a resonant frequency of LC resonant circuit. These two noise sources can be of particular importance in a $1/f^2$ region around an offset frequency from the carrier of $f_o/f^2$, in which f can represent an offset from resonant frequency of an LC oscillator, such as an LC tank. For example, $f_o$ can be approximately $$2\pi * \frac{1}{\sqrt{LC}}$$

for an LC tank, in which L can represent an inductance of the LC tank and C can represent a capacitance of the LC tank. On a log plot of phase noise versus offset frequency from the carrier, the $1/f^2$ region can have a fixed slope of −20 dB/dec for LC oscillators. The $1/f^2$ region can correspond to thermal noise of an oscillator. Accordingly, reducing thermal noise of the oscillator can reduce noise in the $1/f^2$ region. One or more aspects of the systems, apparatus, and methods provided herein can, among other things, reduce noise generated by the first noise source and/or to reduce noise generated by the second noise source.

Although non-silicon based processes, such as GaAs processes, have been used for some conventional oscillators with low phase noise, providing low phase noise and/or ultra-low phase noise oscillators on a CMOS and/or a BiCMOS process is desirable. One advantage of implementing an oscillator in CMOS and/or SiCMOS is that such an oscillator can be integrated along with other circuitry formed by the CMOS and/or SiCMOS process. For example, it is projected that a need will exist in the context of base stations to integrate several components onto a single chip, such as one or more analog-to-digital converters (ADCs), one or more frequency synthesizers each having at least one voltage-controlled oscillator (VCO), one or more digital signal processors (DSPs), the like, or any combination thereof. A CMOS and/or BiCMOS process can provide a cost effective way to implement such integration. Reducing phase noise of an oscillator such that the oscillator can meet noise specifications and be manufactured via a CMOS and/or BiCMOS process is one object, among others, of one or more aspects of the technology described in this disclosure. However, it will be understood that the circuits illustrated and/or described herein can be manufactured via any suitable process.

Phase noise from the first noise source described earlier can be reduced via a passive impedance network, which can bias active devices of the sustaining amplifier such that a conduction angle of the sustaining amplifier is decreased. For instance, a differential inductor can be configured to implement such biasing. This biasing can reduce an amount of radio frequency (RF) current and/or a duration of time for which the RF current is injected to or from the resonant circuit 12. The passive impedance network can include an inductor, which can create a second resonant circuit with capacitance of a sustaining amplifier. The second resonant circuit can be coupled to the gate and/or drain of a field effect transistor of the sustaining amplifier, in some implementations. In the second resonant circuit, the inductor can resonate a capacitance associated with the sustaining amplifier. For example, the inductor can resonate the capacitance associated with the sustaining amplifier so as to increase the tunability of the resonant circuit 12. As another example, the inductor can resonate the capacitance associated with the sustaining amplifier so as to reduce phase noise of the oscillator. As yet another example, the inductor can resonate the capacitance associated with the sustaining amplifier so as to reduce a conduction angle of the sustaining amplifier. The capacitance associated with the sustaining amplifier can be a parasitic capacitance of the sustaining amplifier. More detail regarding reducing phase noise from the first noise source will be provided below, for example, with reference to FIGS. 3A-6B.

Phase noise from the second source described earlier can be reduced via a switching circuit (for example, a capacitor switching circuit) that includes active circuit elements, such as transistors, configured to reduce the contribution of switch noise to the phase noise of the oscillator. Reducing phase noise generated by the second source appears to have been ignored and/or not addressed in the relevant literature. More detail regarding reducing phase noise from the second noise source will be provided below, for example, with reference to FIGS. 8A-11D. Any combination of features described herein with reference to an oscillator configured to reduce noise from the first noise source can be implemented in conjunction with an oscillator having any combination of features described herein related to reducing noise from the second noise source.

The headings provided herein are provided for convenience only and do not necessarily affect the scope or meaning of the claimed invention.

Reducing Noise Generated by Sustaining Amplifier

Thermal noise current of a sustaining amplifier of an oscillator can cause and/or contribute to the first noise source described earlier. The thermal noise current can be represented by an RF current waveform of the oscillator, for example, as shown in FIG. 2.

Figure 2:
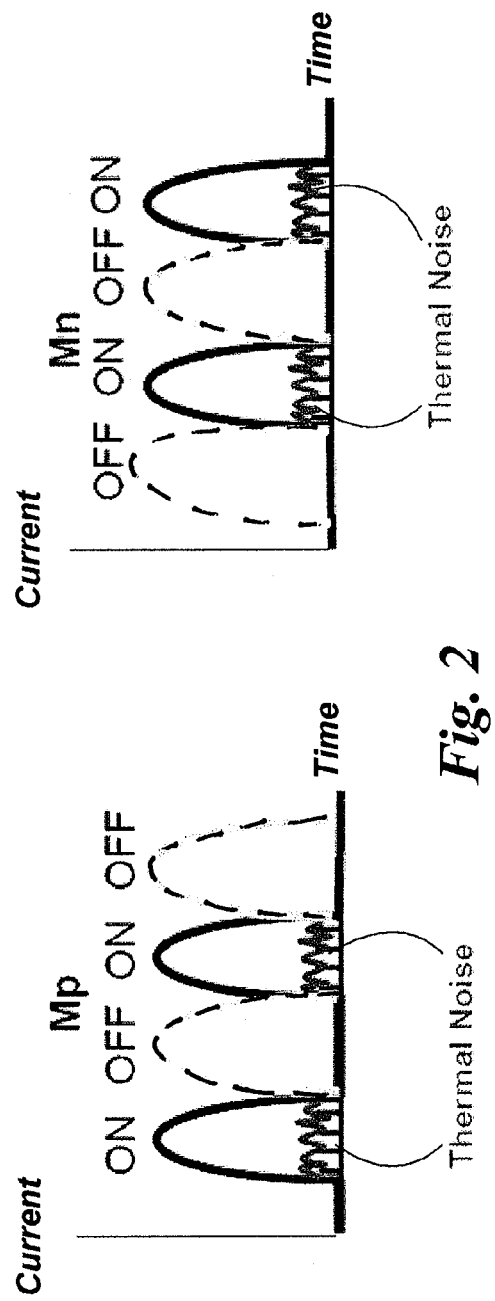
FIG. 2 is graph illustrating thermal noise current in a sustaining amplifier of the oscillator of FIG. 1.

FIG. 2 is graph illustrating thermal noise current in a sustaining amplifier of the oscillator of FIG. 1. Transistors Mp and Mn can represent opposing transistors in a differential pair of transistors of the sustaining amplifier, for example, as shown in the embodiments illustrated in any of FIGS. 3A, 3B, 3C and/or 4. The darker line in the Mp graph represents current at the drain of Mp while Mp is on, and the lighter line in the Mp graph represents current at the drain of Mn while Mp is off. Similarly, the darker line in the Mn graph represents current at the drain of Mn while Mn is on, and the lighter line in the Mn graph represents current at the drain of Mp while Mn is off.

FIG. 2 also illustrates the thermal noise current generated by transistors Mp and Mn while these transistors are on. Such thermal noise can be injected into a resonant circuit at zero crossing points of an output voltage waveform of the oscillator. The thermal noise generated by the transistor Mp can be injected into a resonant circuit, such as an LC tank, at an inverted node (for example, node N2), and the thermal noise generated by the transistor Mn can be injected into the resonant circuit at a non-inverted node (for example, node N1) of the oscillator. The thermal noise current can represent an RF current. The sum of the thermal noise generated by the transistors Mp and Mn can be injected into the resonant circuit.

An oscillator can be sensitive to noise injected into an LC tank or other resonant circuit at zero crossing points, in which an output voltage waveform of the oscillator crosses zero volts. Noise at zero crossing points can cause an irrecoverable phase disturbance. A zero crossing point can occur at a transition between the off state and the on state of the transistors Mp and Mn of the sustaining amplifier. For example, a zero crossing point can be represented by the differential drain voltages of transistors Mp and Mn of the sustaining amplifier 2 both approaching zero volts. Because a transition from the on state to the off state of transistor Mp or Mn can not be instantaneous, there is a finite amount of time in which the thermal noise current generated by both transistors Mp and Mn is present at the sensitive zero crossing points. As a result, thermal noise can have the greatest effect on phase noise when the transistors in the sustaining amplifier are switching on and/or off. A reduction in an amount of time that thermal noise current is present at the zero crossing instants can result in a reduction in an amount of cyclo-stationary noise injected into the LC tank or other resonant circuit. Consequently, the overall phase noise of the oscillator can be decreased by reducing noise at zero crossing points.

Another challenge in reducing noise at zero crossing points relates to the effect of parasitics of the sustaining amplifier on the resonant circuit. For example, increasing the size of transistors in the sustaining amplifier can increase parasitic capacitance on the LC tank. Increasing fixed capacitance in the LC tank, can reduce the impact of similarly sized tuning capacitors configured to be switched in/out with capacitor(s) in the LC tank to tune the resonant frequency. To maintain a similar level of tunability, the size of tuning capacitors can be increased to account for the parasitic capacitance of transistors of the sustaining amplifier. This can increase the phase noise of the oscillator, which can be undesirable.

Phase noise from the first source can be reduced via a passive impedance network, which can include, for example, a differential inductor, to bias active devices of the sustaining amplifier such that a conduction angle of the amplifier can be reduced. The conduction angle, which can also be referred to as an angle of flow, of an amplifier can represent a portion of the oscillator cycle during which devices of the amplifier conduct current. Alternatively or additionally, an amount of radio frequency (RF) thermal noise current and/or a duration of time for which the RF thermal noise current is injected to or from the LC resonator can be substantially reduced.

Figures 3A, 3B:
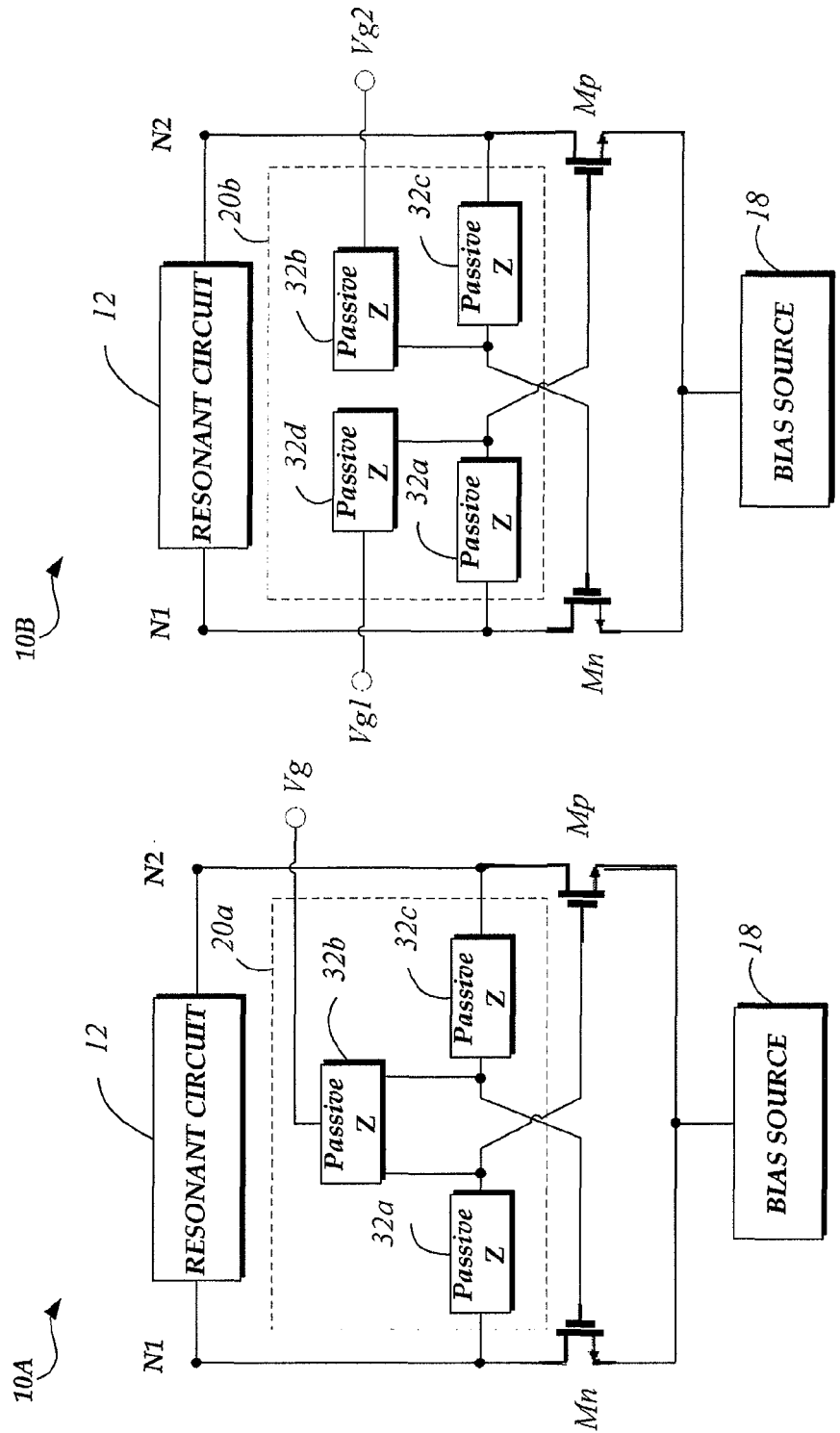
FIG. 3A is a schematic diagram illustrating a passive impedance network configured to bias control inputs of switches in a sustaining amplifier, according to an embodiment.
FIG. 3B is a schematic diagram illustrating another passive impedance network configured to bias control inputs of switches in a sustaining amplifier, according to another embodiment.

FIG. 3A is a schematic diagram illustrating a passive impedance network 20a configured to bias control inputs of switches in a sustaining amplifier, according to an embodiment. The passive impedance network 20a can apply a bias to control terminals of the switches, such as transistors Mn and Mp, to enable the switches to switch faster at zero crossing points. For instance, the bias can increase the bias voltage applied to the control terminals of transistors Mn and Mp. Increasing the switching speed of the transistors Mn and Mp via such biasing can reduce an amount of time for which both of the switches Mn and Mp are at least partially on. As a result, at zero crossing points, an amount of time during which both switches Mn and Mp inject thermal noise into the resonant circuit 12 can be reduced, thereby reducing phase noise in the oscillator 10a.

The transistor Mn can be configured to drive a non-inverted node (for example, node N1) of the resonant circuit 12 based on a voltage at an inverted node (for example, node N2) of the resonant circuit 12, and the transistor Mp can be configured to drive the inverted node of the resonant circuit 12 based on a voltage at the non-inverted node of the resonant circuit 12. When the transistor Mn is an NMOS transistor, the non-inverted node can be pulled down when the inverted node is high. Similarly, when the transistor Mp is an NMOS transistor, the inverted node can be pulled down when the non-inverted node is high. Although the transistors Mn and Mp are illustrated as field effect transistors for illustrative purposes, the transistors can be bipolar transistors or any other suitable transistors, which can be formed by any suitable process.

To increase the switching speed of the transistors Mn and Mp, a gate bias voltage Vg can be applied to their respective gates while the gate bias voltage Vg is electrically isolated from the inverted node and the non-inverted node of the resonant circuit 12 by the passive impedance network 20a. Thus, the voltage applied to the gate of transistor Mn can be based on a voltage at the inverted node and the gate bias voltage Vg and the voltage applied to the gate of the transistor Mp can be based on a voltage at the non-inverted node and the gate bias voltage Vg. The bias voltage Vg can be generated by an independent bias circuit. In some implementations, the bias circuit can be programmable and configured to minimize and/or reduce phase noise. The bias applied by the passive impedance network 20a can have relatively low noise. The gate bias voltage Vg can increase the voltage applied to the gates of the transistors Mn and Mp beyond the voltage provided from the non-inverted node and the inverted node of the resonant circuit 12 when the transistors Mn and Mp are p-type transistors. Conversely, when the transistors Mn and Mp are n-type transistors, the gate bias voltage Vg can decrease the voltage applied to the gates of the transistors Mn and Mp beyond the voltage provided from the non-inverted node and the inverted node of the resonant circuit 12.

The passive impedance network 20a can include one or more passive impedance elements, such as passive impedance elements 32a, 32b, and 32c. The passive impedance elements 32a, 32b, and 32c can be explicit passive impedance elements rather than merely parasitic impedances. The first explicit passive impedance element 32a can block a direct current (DC) voltage from being applied to the gate of transistor Mp. Similarly, the third explicit passive impedance element 32c can block a DC voltage from being applied to the gate of transistor Mn. The first and third explicit passive impedance elements 32a, 32c can include inductors, capacitors, resistors, or other passive circuit elements. In some implementations, the first and third explicit passive impedance elements 32a, 32c can both be capacitors.

The second explicit passive impedance element 32b can be configured to provide a low-noise, high impedance characteristic at the resonant frequency ω of the resonant circuit 12. In some implementations, the resonant frequency ω can be in the RF frequency range. The low-noise, high impedance characteristic can enable faster switching of the transistors Mn and Mp. The amount of time that the transistors Mn and/or Mp operate in the Ohmic region can also be reduced by applying the gate bias voltage Vg via the second explicit passive impedance element 32b. The second passive impedance element 32b can be a differential inductor in some implementations.

In addition to reducing phase noise of the oscillator 10, the passive impedance network 20a can increase the voltage swing at an output of the oscillator 10, for example, by reducing common mode current. The second explicit passive impedance element 32b can reduce parasitics of the transistors Mn and Mp on the non-inverted node and the inverted node of the resonant circuit 12. This can enable the transistors Mn and Mp to be relatively large, with relatively large parasitic capacitance in relation to an effective capacitance of an LC tank, without having a significant impact on the tunability of the LC tank.

FIG. 3B is a schematic diagram illustrating a passive impedance network 20b configured to bias control inputs of switches in a sustaining amplifier, according to another embodiment. The oscillator 10b illustrated in FIG. 3B has a different passive impedance network from the oscillator 10a in FIG. 3A, otherwise these oscillators are substantially the same and/or functionally similar. In the passive impedance network 20b, separate second and fourth explicit passive impedance elements 32b and 32d can separately apply a bias to gates of transistors Mn and Mp, respectively. As illustrated in FIG. 3B, the gates of the transistors Mn and Mp can be biased with bias voltages $V_{G2}$ and $V_{G1}$, respectively. The bias voltages $V_{G2}$ and $V_{G1}$ can have different voltages in some implementations. In other implementations, the gates of transistors Mn and Mp can be biased by bias voltages $V_{G2}$ and $V_{G1}$ having substantially the same voltage. The passive impedance network 20b can be functionally similar to the passive impedance network 20a.

Figure 3C:
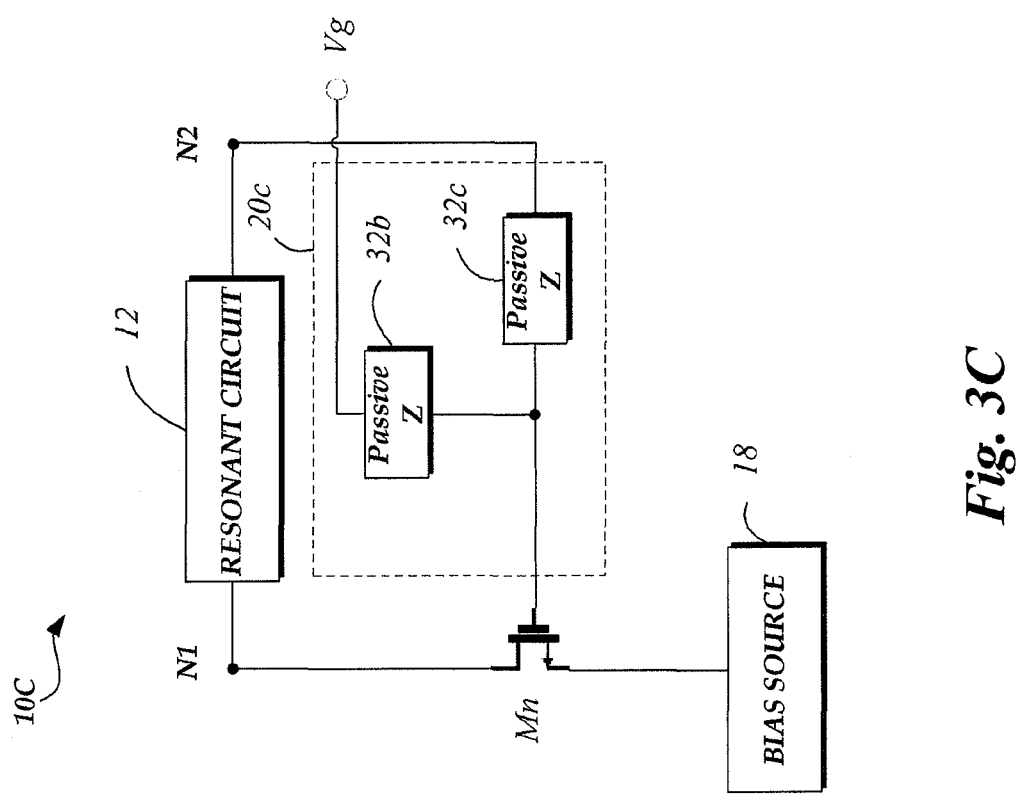
FIG. 3C is a schematic diagram illustrating another passive impedance network configured to bias control an input of a switch in a single sided sustaining amplifier, according to another embodiment.

FIG. 3C is a schematic diagram illustrating a passive impedance network 20c configured to bias control an input of a switch in a sustaining amplifier, according to another embodiment. The oscillator 10c illustrated in FIG. 3C has a single ended sustaining amplifier, instead of a differential sustaining amplifier like in the oscillators 10a and 10b. Besides having a single ended sustaining amplifier and a different passive impedance network, the oscillator 10c can be substantially the same and/or functionally similar to the oscillators 10a and/or 10b.

The passive impedance network 20c can include the second explicit passive impedance element 32b and the third explicit passive impedance element 32c, which can include any combination of features described herein with reference to these explicit passive impedance elements. For example, the third explicit passive impedance element 32c can block a direct current (DC) voltage from being applied to the gate of transistor Mn. A first end of the third explicit passive impedance element 32c can be coupled to an inverted node (for example, node N2) and a second end of the third explicit passive impedance element 32c can be coupled to a control terminal (such as a gate when Mn in a field effect transistor) of the transistor Mn. The third explicit passive impedance element 32c can be a capacitor according to some implementations. In the passive impedance network 20c, the second explicit passive impedance element 32b can apply a bias $V_G$ to the gate of the transistor Mn. In some implementations, the second explicit passive impedance element 32b can be an inductor. A first end of the second explicit passive impedance element can receive the bias $V_G$ and a second end of the second explicit passive impedance element 32b can apply the bias $V_G$ to the gate of the transistor Mn. The passive impedance network 20c can be functionally similar to the passive impedance networks 20a and/or 20b, but in the context of a single ended sustaining amplifier.

Figure 4:
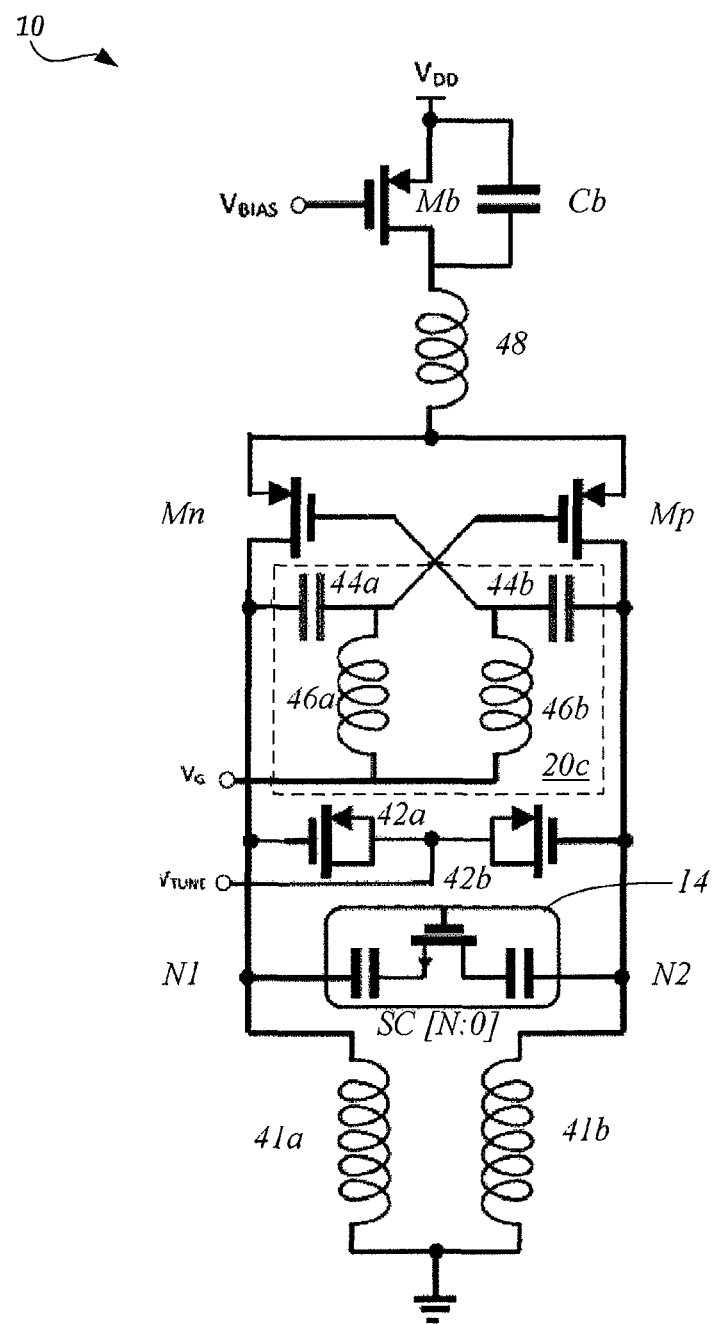
FIG. 4 is a schematic diagram of an oscillator including a passive impedance network configured to bias a sustaining amplifier, according to an embodiment.

FIG. 4 is a schematic diagram of an oscillator 10 including a passive impedance network 20c configured to bias a sustaining amplifier, according to an embodiment. The oscillator 10 illustrated in FIG. 4 is in an LC tank configuration. The LC tank can include first and second inductors 41a and 42b and a capacitor switching network 14.

The inductive circuit elements of the LC tank can include the first and second inductors 41a and 41b. The first inductor 41a can include a first end coupled to a power rail (for example, ground) and a second end coupled to the first node N1. The second inductor 41b can include a first end coupled to a power rail (for example, ground) and a second end coupled to the second node N2. The effective inductance of the LC tank can be based on inductance values of the first inductor 41a and the second inductor 41b.

The capacitor switching network 14 can adjust the resonant frequency of the oscillator 10. The capacitor switching network 14 can include a plurality of capacitors that can be coupled in series with the first and second inductors 41a and 41b. For example, as the switching network 14 can include N switching circuits SC[N:0] that each include a switch and one or more capacitive circuit elements. Each of the plurality of capacitors can be coupled in parallel with each other to increase the effective capacitance of the LC tank. Control signals can toggle switches in the switching circuits SC[N:0] to add and/or remove additional capacitance from the effective capacitance of the LC tank, which can represent the combined capacitance of the tunable capacitance elements that are part of the LC tank circuit. For instance, each capacitor of the capacitor switching network 14 circuit can be selectively included or excluded from the effective capacitance of the LC tank based on values of the capacitance control signals opening and/or closing switches, such as transistors. With additional capacitance, the oscillator frequency can decrease. Conversely, with reduced capacitance, the oscillator frequency can increase.

The oscillator 10 illustrated in FIG. 4 is a VCO. A tuning voltage $V_{TUNE}$ can be applied to tuning elements 42a and 42b to apply change the frequency of the LC tank. The tuning voltage $V_{TUNE}$ can control the output frequency of the oscillator 10.

The passive impedance network 20c can include a first capacitor 44a, a second capacitor 44b, a first biasing inductor 46a, and a second biasing inductor 46b. The passive impedance network 20c can apply a bias voltage Vg to gates of transistors Mn and Mp so as to reduce the voltage at the gates of transistors Mn and Mp. The first capacitor 44a can have a first end coupled to the first node N1 and a second end coupled to the gate of the transistor Mp. The first capacitor 44a can have a capacitance selected to block a DC voltage at the first node N1 from being applied to the gate of the transistor Mp. The second capacitor 44b can have a first end coupled to the second node N2 and a second end coupled to the gate of the transistor Mn. The second capacitor 44b can have a capacitance selected to block a DC voltage at the second node N2 from being applied to the gate of the transistor Mn. The first biasing inductor 46a can have a first end coupled to a circuit element driving the gate biasing voltage Vg and a second end coupled to the gate of the transistor Mp. Similarly, the second biasing inductor 46b can have a first end coupled to a circuit element driving the gate biasing voltage Vg and a second end coupled to the gate of the transistor Mn. The first biasing inductor 46a and the second biasing inductor 46b can have inductances suitable to provide a low noise, high impedance at a resonant frequency of the oscillator 10.

The sustaining amplifier of the oscillator 10 illustrated in FIG. 4 includes transistors Mn and Mp. Transistors Mn and Mp can implement one or more features of any of the sustaining amplifiers described herein.

The oscillator 10 can include a tail inductor 48. The tail inductor 48 can have a first end coupled to the source of at least one transistor Mn and/or Mp of the sustaining amplifier and a second end coupled to a drain of a transistor Mb configured to provide a bias current to the sustaining amplifier. The inductance of the tail inductor 48 can be selected such that the tail inductor 48 is configured to resonate at a desired frequency and block a single-ended path to AC ground at the desired frequency. For example, in some implementations, the tail inductor 48 can to configured to resonate the parasitic capacitance at a common source node of the sustaining amplifier at twice the resonant frequency ω of the oscillator 10. This can effectively increase the impedance of the bias current source at the second harmonic. As a result, the second harmonic of the thermal noise current may not have a single-ended path to the AC ground. The tail inductor 48 can be included in the bias source 18 of FIGS. 3A and/or 3B.

The bias source of the oscillator 10 illustrated in FIG. 4 also includes a bias transistor Mb and a bias capacitor Cb. The bias transistor Mb can have a gate coupled to a bias voltage Vbias. The bias transistor Mb can be configured to drive a current from a power rail (for example, Vdd) to a common node of the sustaining amplifier. As such, the bias transistor can be configured as a current source. The bias capacitor Cb can have a first end coupled to a source of the bias transistor Mb and a second end coupled to the drain of the bias transistor. The bias capacitor Cb can filter out noise from the bias source transistor.

Although three example passive impedance networks are provided for illustrative purposes, it will be understood that a number of other passive impedance can implement one or more aspects of the present disclosure to thereby reduce phase noise generated by a sustaining amplifier. Likewise, although n-type or p-type transistors are shown in FIGS. 3A, 3B, 3C, and 4 for illustrative purposes, it will be understood that the illustrated oscillators can be modified to the mirror image configuration by swapping n-type and p-type transistors, reversing currents, and swapping voltage rails. For example, in FIGS. 3A-3C the illustrated sustaining amplifiers include NMOS devices Mn and Mp and in FIG. 4 the illustrated sustaining amplifier includes PMOS devices Mn and Mp. In some embodiments, an oscillator can include two sustaining amplifiers, one with n-type devices and one with p-type devices. One or more of these two sustaining amplifier can be biased by a passive impedance network that includes any combination of features described with reference to the passive impedance networks described herein.

Figure 5:
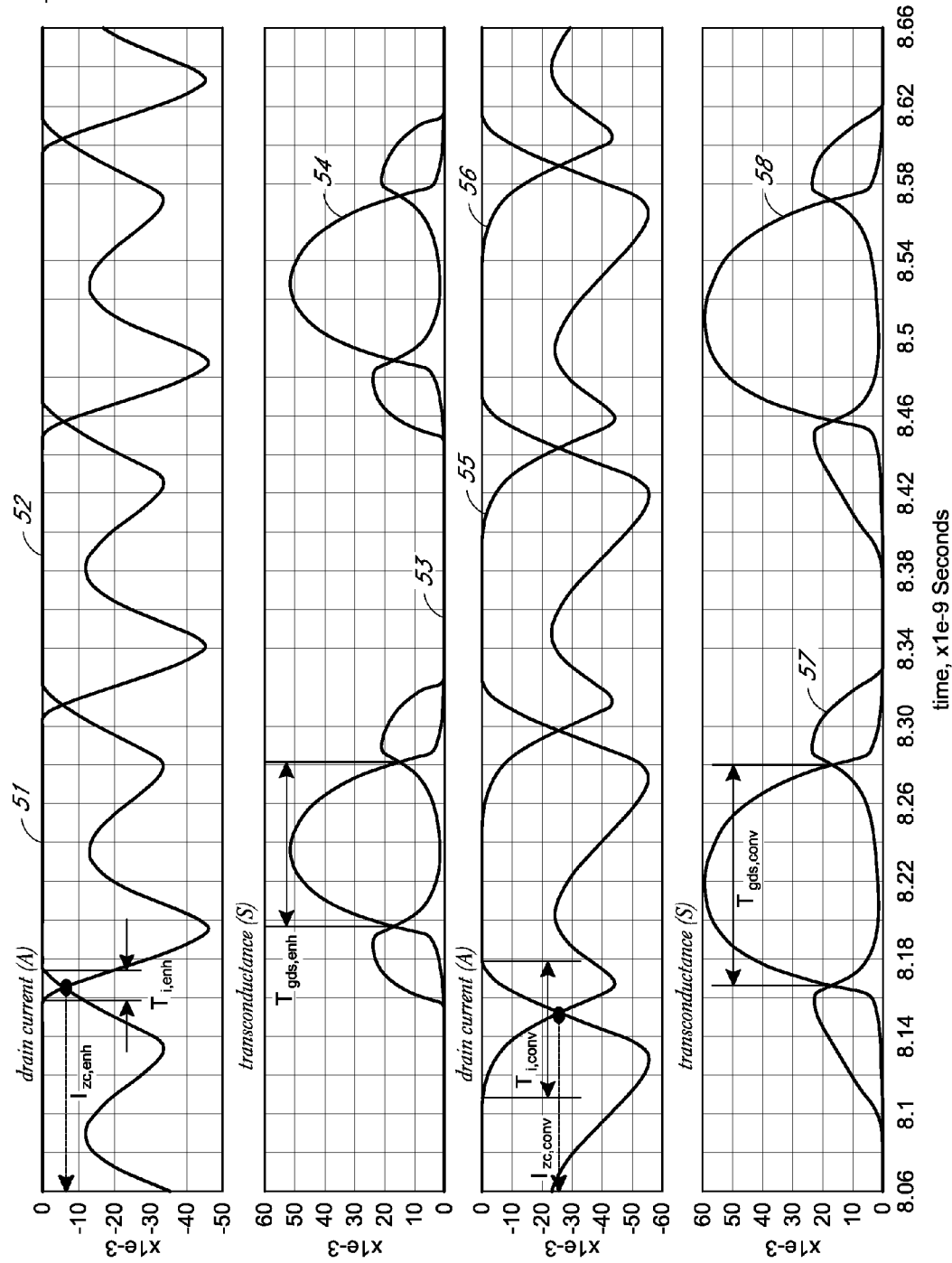
FIG. 5 shows graphs illustrating a relationship among transconductances and current at the drains of differential transistors in a sustaining amplifier that indicate a reduction in zero crossing noise according to an embodiment.

FIG. 5 shows graphs illustrating a relationship among transconductances and current at the drains of differential transistors in a sustaining amplifier that indicate a reduction in zero crossing noise, according to an embodiment. The graphs of FIG. 5 show the relationship among time-domain waveforms of an oscillator with a passive impedance network similar to the passive impedance network 20c of FIG. 4 and a similar oscillator without a passive impedance network. The graphs of FIG. 5 illustrate sustaining amplifier transistor drain currents and transconductances for transistors Mn and Mp of a sustaining amplifier (for example, as shown in FIG. 3A, 3B, or 4). The top two graphs are simulation results of a VCO that is functionally similar to the oscillator of FIG. 4, and the bottom two graphs are simulation results of a similar VCO without a passive impedance network.

With continued reference to FIG. 5, the drain current of transistor Mn is represented by the curve 51 and the drain current of transistor Mp is represented by the curve 52 for the oscillator with the passive impedance network. The transconductance of transistor Mn is represented by the curve 53 and the transconductance of transistor Mp is represented by the curve 54 for the oscillator with the passive impedance network. The drain current of transistor Mn is represented by the curve 55 and the drain current of transistor Mp is represented by the curve 56 for the oscillator without the passive impedance network. The transconductance of transistor Mn is represented by the curve 57 and the transconductance of transistor Mp is represented by the curve 58 for oscillator without the passive impedance network.

In FIG. 5, a time period $Tgds_{ENH}$ in which the sustaining amplifier transistors of the oscillator with the passive impedance network stay on during the zero crossing instant of the oscillator output is significantly reduced compared to a time period $Tgds_{CONV}$ in which the sustaining amplifier transistors of the oscillator without the passive impedance network stay on during the zero crossing instant. As shown in FIG. 5 and summarized in Table 1 below, the time period in which transistors in sustaining amplifiers are on can be reduced by a factor of about 4.5 times or more, in some implementations. This can also correspond to a reduction of thermal noise current injected into the LC tank at the zero crossing instants. More specifically, according to the simulation results shown in FIG. 5, the amount of RF current $Izc_{ENH}$ injected in the oscillator with the passive impedance network should be about 5 times less than the thermal noise current $Izc_{CONV}$ injected in the oscillator without the passive impedance network. The reduction in the time in which sustaining amplifier transistors stay on during the zero crossing instant of the oscillator output can translate into a significant reduction in the thermal noise injected into the LC tank at the sensitive zero-crossing instants, which in turn can result in a reduction in the oscillator phase noise.

The simulation results shown in FIG. 5 also indicate that the period of time $Ti_{ENH}$ in which the sustaining amplifier transistors of the oscillator with the passive impedance network operate in the linear region should be about 1.4 times less than the time $Ti_{ConV}$ in which the sustaining amplifier transistors of the oscillator without the passive impedance network operate in the linear region. This can represent a reduction in the amount of time in which the sustaining amplifier transistors load the oscillator LC tank and hence a reduction in the noise contributed by this resistive loading to the thermal noise in the $1/f^2$ region of the oscillator phase noise.

Table 1 below summarizes measurements of Ti and Tgds derived from the graphs shown in FIG. 5.

TABLE 1

| | |
|---|---|
| $Ti_{ENH}$ | 0.015 ns |
| $Ti_{ConV}$ | 0.070 ns |
| $Tgds_{ENH}$ | 0.081 ns |
| $Tgds_{ConV}$ | 0.115 ns |

Figure 6A:
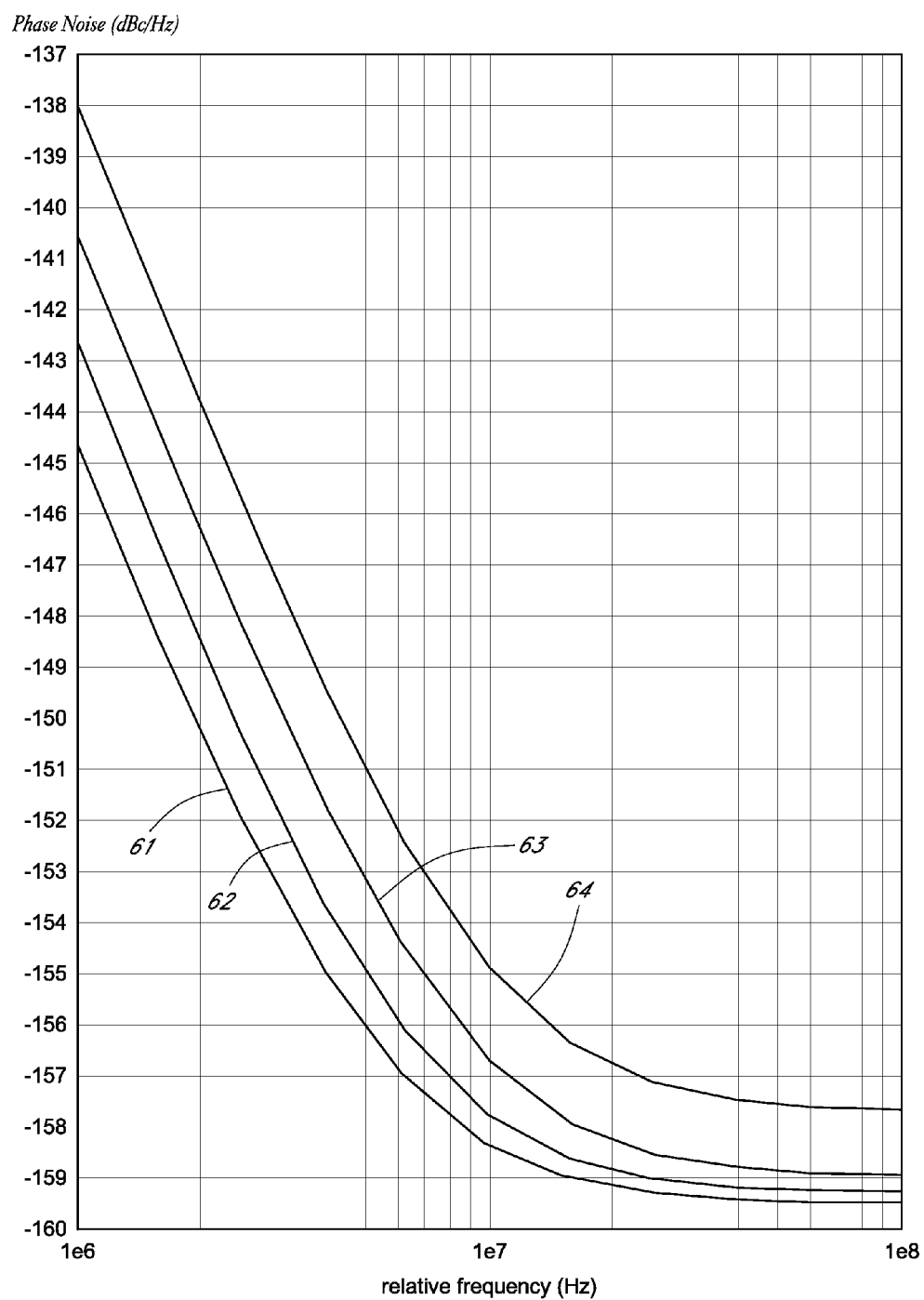
FIGS. 6A and 6B are graphs illustrating relationships among phase noise and frequency that show improved noise performance for oscillators with passive impedance networks configured to bias sustaining amplifiers.
Figure 6B:
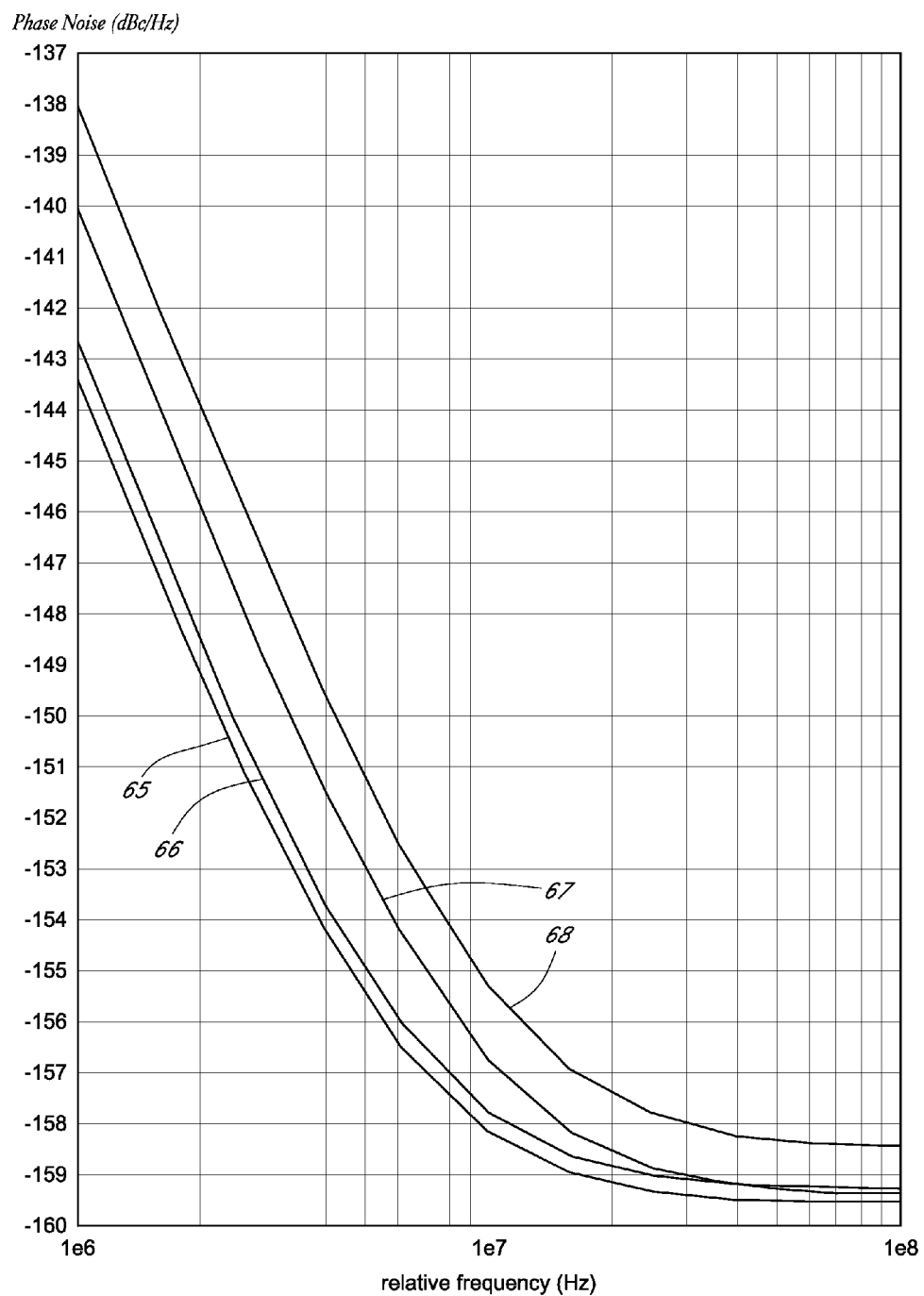

FIGS. 6A and 6B are graphs illustrating relationships among phase noise and frequency that show improved noise performance for oscillators with passive impedance networks configured to bias sustaining amplifiers. These graphs show comparative simulations illustrating the improvement in performance achieved by oscillators with passive impedance networks compared to oscillators without passive impedance networks in terms of phase noise at roughly the same bias current conditions. A first oscillator with the passive impedance network in these simulations is a VCO that is functionally similar to the oscillator of FIG. 4, and a second oscillator without the passive impedance network is similar to the oscillator of FIG. 4 with the exception of the passive impedance network.

FIG. 6A shows a phase noise comparison between the first oscillator and the second oscillator for a lowest frequency band in both high and low bias conditions. In contrast, FIG. 6B shows a phase noise comparison between first oscillator and the second oscillator for a highest frequency band for both high and low bias conditions. The simulated oscillators each have 64 frequency bands that can be selected by six separate switching circuits in the switching network 14 of FIG. 1. More specifically, in FIG. 6A, the phase noise of the lowest frequency band under high bias conditions in the first oscillator is represented by curve 61, the phase noise of the lowest frequency band under low bias conditions in the second oscillator is represented by curve 62, the phase noise of the lowest frequency band under high bias conditions in the second oscillator is represented by curve 63, the phase noise of the lowest frequency band under low bias conditions in the second oscillator is represented by curve 64. In FIG. 6B, the phase noise of the highest frequency band under high bias conditions in the first oscillator is represented by curve 65, the phase noise of the highest frequency band under low bias conditions in the first oscillator is represented by curve 66, the phase noise of the highest frequency band under high bias conditions in the second oscillator is represented by curve 67, the phase noise of the highest frequency band under low bias conditions in the second oscillator is represented by curve 68.

Table 2 shows that for the same bias current at the lowest bias current setting in both the first oscillator and the second oscillator, the oscillator RMS fundamental voltage is higher for the first oscillator that includes a passive impedance network. This can be a result of the reduction in time in which the enhanced oscillator sustaining amplifier transistors operate in the linear region. The phase noise improvement achieved by using the first oscillator shown by FIGS. 6A and 6B is about 4.6 dBc/Hz for the lowest band setting and 5.6 dBc/Hz for the highest band setting at 1 MHz frequency offset from the RF carrier.

TABLE 2

| | Oscillator without Passive Impedance Network (highest frequency band, low bias) | Oscillator with Passive Impedance Network (highest frequency band, low bias) | Oscillator without Passive Impedance Network (lowest frequency band, low bias) | Oscillator with Passive Impedance Network (lowest frequency band, low bias) |
|---|---|---|---|---|
| Oscillator Fundamental Frequency | 3.45 GHz | 3.41 GHz | 3.03 GHz | 3.05 GHz |
| Oscillator Core Current Consumption | 29.99 mA | 29.46 mA | 35.88 mA | 35.46 mA |
| Oscillator Core RMS Fundamental Voltage of Carrier | 3.58 V | 4.63 V | 3.32 V | 4.17 V |
| Relative Difference in RMS Amplitude | 0 dB | 2.25 dB | 0 dB | 2.86 dB |
| Total Phase Noise (dBc/Hz) | | | | |
| 0.4 MHz | −129.86 | −133.97 | −130.63 | −136.11 |
| 1 MHz | −138.00 | −142.60 | −138.63 | −144.16 |
| 10 MHz | −155.30 | −157.79 | −155.34 | −157.88 |
| 100 MHz | −158.45 | −159.29 | −157.99 | −158.96 |

Table 3 shows a comparison between the first oscillator and the second oscillator at a high current setting. At the high current setting in which the oscillator is supply voltage limited, hard gate oxide breakdown and/or hot carrier effects can limit operation. Simulation indicates that the first oscillator with a passive impedance network can achieve 3.5 dBc/Hz better phase noise at 1 MHz frequency offset from the RF carrier for the lowest band setting and 5.6 dBc/Hz better phase noise for the highest band compared to the second oscillator without the passive impedance network.

TABLE 3

| | Oscillator without Passive Impedance Network (highest frequency band, high bias) | Oscillator with Passive Impedance Network (highest frequency band, high bias) | Oscillator without Passive Impedance Network (lowest frequency band, high bias) | Oscillator with Passive Impedance Network (lowest frequency band, high bias) |
|---|---|---|---|---|
| Oscillator Fundamental Frequency | 3.44 GHz | 3.38 GHz | 3.03 GHz | 3.04 GHz |
| Oscillator Core Current Consumption | 44.22 mA | 47.73 mA | 47.53 mA | 51.02 mA |
| Oscillator Core RMS Fundamental Voltage of Carrier | 4.78 V | 5.15 V | 4.32 V | 4.72 V |
| Relative Difference in RMS Amplitude | 0 dB | 0.65 dB | 0 dB | 0.77 dB |
| Total Phase Noise (dBc/Hz) | | | | |
| 0.4 MHz | −131.92 | −134.93 | −132.57 | −136.70 |
| 1 MHz | −140.00 | −143.36 | −140.52 | −144.65 |
| 10 MHz | −156.76 | −158.16 | −156.71 | −158.39 |
| 100 MHz | −159.39 | −159.57 | −158.96 | −159.50 |

Reducing Noise Generated by Switching Network

Phase noise of a second source can be generated by a switching network configured to tune a resonant circuit, such as an LC tank, to a desired resonant frequency. A switch configured to switch in and/or switch out circuit elements, such as capacitors, to vary the resonant frequency can be biased such that nodes of the switch are not floating when the switch is off. When the switch is off, a high impedance asserted on nodes of the switch can reduce contributions of the switching circuit to the phase noise of the oscillator.

However, generating a high impedance when the switch is off can be expensive to implement via large resistors, for example, resistors having a resistance from about 100 k Ohms to about 150 k Ohms. In switching circuits (for example, the circuit illustrated in FIG. 7), the parasitic capacitance of such large resistors can affect the ratio of a capacitance when the switch is on or off. This can, for example, reduce the change in resonant frequency of an LC tank when a capacitor is switched in or switched out the LC tank.

FIG. 7 is a block diagram of a switching network 14. The switching network 14 can selectively couple circuit elements across a first node and a second node of a resonant circuit, such as nodes N1 and N2 of the resonant circuit 12 of FIG. 1, to thereby increase and/or decrease the resonant frequency of a resonant circuit. For example, in some implementations, the switching network can selectively couple capacitors across an LC tank to increase and/or decrease the effective capacitance of the LC tank. Adjusting the effective capacitance of the LC tank can adjust the resonant frequency ω of the LC tank, for example, based on Equation 1. A switch, such as a field effect transistor, can be configured to switch-in or switch-out capacitors across the LC tank.

The switching network 14 can include a switching network driver 72 and an array 74 of switching circuits 76a to 76n. The array 74 can be configured to selectively couple circuit elements to a first node N1 and a second node N2 of the resonant circuit to adjust the resonant frequency ω of the resonant circuit 12 to a selected frequency band. The first node N1 and the second node N2 can be a non-inverted node and an inverted node, respectively. Control signals Control [2N-1:0] can be generated by the switching network driver 72 to turn switches of switching circuits 76a to 76n on and/or off. At least some of control signals Control [2N-1:0] can select a frequency band by turning on selected switches within the switching circuits 76a to 76n. The signals that select the frequency band can be referred to as band control signals.

The switching network driver 72 can include a level shifter and an array of buffer drivers. The level shifter can generate a control bias voltage to control the switches and an intermediate node bias voltage to bias other nodes of the switches. For instance, the control bias voltage can be coupled to a gate of a field effect transistor in a switching circuit, and the intermediate node bias voltage can be coupled to a source and a drain of the field effect transistor in the switching circuit. The level shifter can adjust the voltage level of a supply voltage (for example, a battery voltage) to the control bias voltage and the intermediate node bias voltage. In some implementations, an off-chip capacitor can filter out noise on one or more of the bias voltages. The bias voltages can be used as logical high voltages for devices in the array of buffer drivers. The array of buffer drivers can drive the control bias voltage and the intermediate node bias voltage to switching circuits 76a to 76n. Using the level-shifted high voltage values generated by the level shifter can avoid breakdown of the junctions of the switches in the switching circuits 76a to 76n.

Each switching circuit 76a to 76n can receive at least one band control signal to turn a switch on or off. When the switch is on, at least one circuit element, such as a capacitor, can be coupled to the first node N1 (for example, a non-inverted node) and a second node N2 (for example, an inverted node) of the oscillator. For example, in an LC tank implementation, when the switch is on, a first end of a capacitor can be coupled to node N1 and a second end of the capacitor can be coupled via the switch to the second node N2. This coupling can increase the capacitance of the LC tank by adding capacitance in parallel, thereby adjusting the resonant frequency ω of the LC tank. Conversely, when the switch is off, at least one circuit element, such as a capacitor, can be uncoupled from at least one of the first node N1 and the second node N2 of the oscillator. For example, in an LC tank implementation, a capacitor can be decoupled from node N1 and node N2 when the switch is off.

When a switch of one of the switching circuits 76a to 76n is on, the impedance of the switch may not introduce significant phase noise to the resonant circuit. Yet, when the switch is off, the second bias voltage can be applied across the switch such that the nodes across the switch do not have undefined voltage. For instance, a source and a drain of a field effect transistor can be biased with the second bias voltage such that the source and the drain do not float.

When the switch is off, a high impedance can be desired to switch out the capacitor from the LC tank. However, when the switch is off, a parasitic capacitance of the switch and/or additional circuitry in the switching circuits 76a to 76n can add capacitance to the LC tank. Additional capacitance added to the effective capacitance of the LC tank can reduce the effectiveness of switching in or switching out a capacitor. Larger switch sizes can exacerbate problems related to the parasitics of the switch when the switch is off. Accordingly, a high impedance and low parasitic capacitance when the switch is off can switch out a capacitor without having the parasitic capacitance of the switch significantly effect the effective capacitance of the LC tank.

Integration of passive circuit elements (for example, large resistors) sufficient to generate a high impedance coupled to the source and/or drain of a switch in a low cost process can be prohibitive. For instance, resistors having an impedance of about 100 kOhm to 150 kOhm can be quite costly. Sensitive circuit areas, as around the RF band switches (for example, switches 84 that will be described with reference to FIGS. 8A, 8B, and/or 9) where the parasitic capacitances introduced as a result of using such a large resistor can be detrimental to the on/off capacitance ratio of the band switch can be problematic.

Figures 8A, 8B:
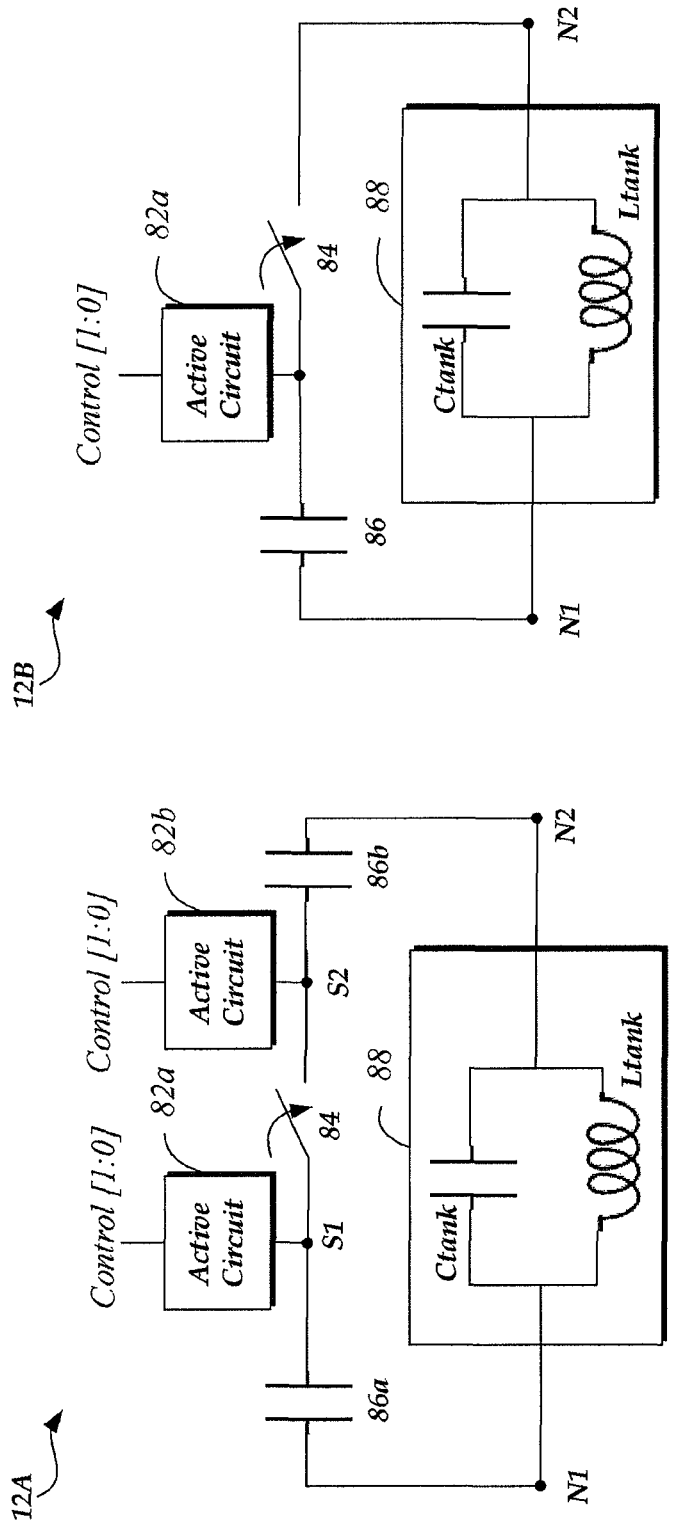
FIG. 8A is a schematic diagram of a resonant circuit including one switching circuit according to an embodiment.
FIG. 8B is a schematic diagram of a resonant circuit including one switching circuit according to another embodiment.

FIG. 8A is a schematic diagram of a resonant circuit 12A including one switching circuit, according to an embodiment. The switching circuit is one example of a switching circuit 76a to 76n of FIG. 7. Although one switching circuit is shown for illustrative purposes, any suitable number of switching circuits can be included in series and/or parallel with the switching circuit illustrated in FIG. 8A. The switching circuit can include a first active circuit 82a, a second active circuit 82b, a switch 84, a first circuit element 86a, and a second circuit element 86b. The switching circuit can be coupled to the first node N1 and the second node N2 of a resonant component 88 of the resonant circuit 12A.

The first active circuit 82a can be coupled to a node S1 that is intermediate a first end of the switch 84 and the first node N1. The node S1 can also be intermediate a first end of the switch 84 and a first end of the first circuit element 86a, for example, as shown in FIG. 8A. A second end of the first circuit element 86a can be coupled to the first node N1 of the resonant component 88. Similarly, the second active circuit 82b can be coupled to a node S2 intermediate a first end of the switch 84 and the second node N2. In some implementations, the second active circuit 82b can be coupled to a node S2 intermediate a second end of the switch 84 and a first end of the second circuit element 86b. A second end of the second circuit element 86b can be coupled to the second node N2 of the resonant component 88.

The first active circuit 82a and the second active circuit 82b include active circuit elements configured to deliver bias voltage. Non-limiting examples of active circuit elements include transistors, diodes, and the like. The first active circuit 82a and/or the second active circuit can receive two bits of the control signals Control [2N-1:0], for example, from the switching network driver 72. One of these two control bits can be used to select a frequency band of operation and the other control bit can be used to apply a bias on an intermediate node, such as node S1 and/or node S2.

The first active circuit 82a can generate an impedance on the node S1. When the switch 84 is off, the first active circuit 82a can generate a high impedance on the node S1. The first active circuit 82a can generate the high impedance based on a bias signal with a different logical high value than a band control signal configured to control the switch. For example, the high impedance can be generated using the intermediate node bias signal described in reference to FIG. 7 and the switch can open and/or close based on the control bias signal described in reference to FIG. 7. The high impedance can be sufficient to effectively create an open circuit between nodes S1 and S2. For instance, in some implementations, the active circuit 82a can generate an impedance of at least about 100 k Ohms, 150 k Ohms, 1M Ohm, 1 G Ohm, or more. When the switch 84 is on, the active circuit 82a can stop generating the high impedance on node S1. Alternatively or additionally, the active circuit 82a can pull down node S1 while the switch is on. For instance, the active circuit 82a can pull down node S1 based on a band control signal configured to open and/or close the switch 84.

The second active circuit 82b can include and/or implement any combination of features of the active circuit 82a. Where the first active circuit 82a is coupled to node S1, the second active circuit 82b is correspondingly coupled to the node S2.

According to some implementations, any of the active circuits 82a and/or 82b can be replaced by a passive circuit that includes an inductor configured to apply a bias voltage in place of the active circuit 82a and/or 82b.

The switch 84 can be any suitable voltage controlled switch. For example, the switch 84 can be a field effect transistor. The switch can open and/or close in response to a control signal, such as a band control signal. The switch 84 can couple the second end of the first circuit element 86a to the second node N2 of the resonant component 88 when on. The switch 84 can also couple the second end of the second circuit element to the first node N1 of the resonant component 88 when on. By selectively coupling the first circuit element 86a and/or the second circuit element 86b across the resonant circuit 88, the switch 84 can adjust the resonant frequency of the resonant circuit 88.

The resonant component 88 can include any circuit configured to oscillate at a resonant frequency. When the switch 84 is on, the illustrated switching circuit can be considered part of the resonant component 88. When the switch 84 is off, the illustrated switching circuit should not be considered part of the resonant component 88. In some implementations, the resonant component 88 can include an LC tank with a capacitor Ctank in parallel with an inductor Ltank. The capacitor Ctank can represent one or more capacitors in series and/or parallel. Likewise, the inductor Ltank can represent one or more inductors in series and/or parallel.

FIG. 8B is a schematic diagram of a resonant circuit 12B including one switching circuit, according to another embodiment. Like the resonant circuit 12A, any suitable number of switching circuits can be included in parallel and/or in series in the resonant circuit 12B. The resonant circuit 12B of FIG. 8B can be substantially the same as the resonant circuit 12A of FIG. 8A, except that the resonant circuit 12B includes a single circuit element 86 instead of the first circuit element 86a and the second circuit element 86b.

Figure 9:
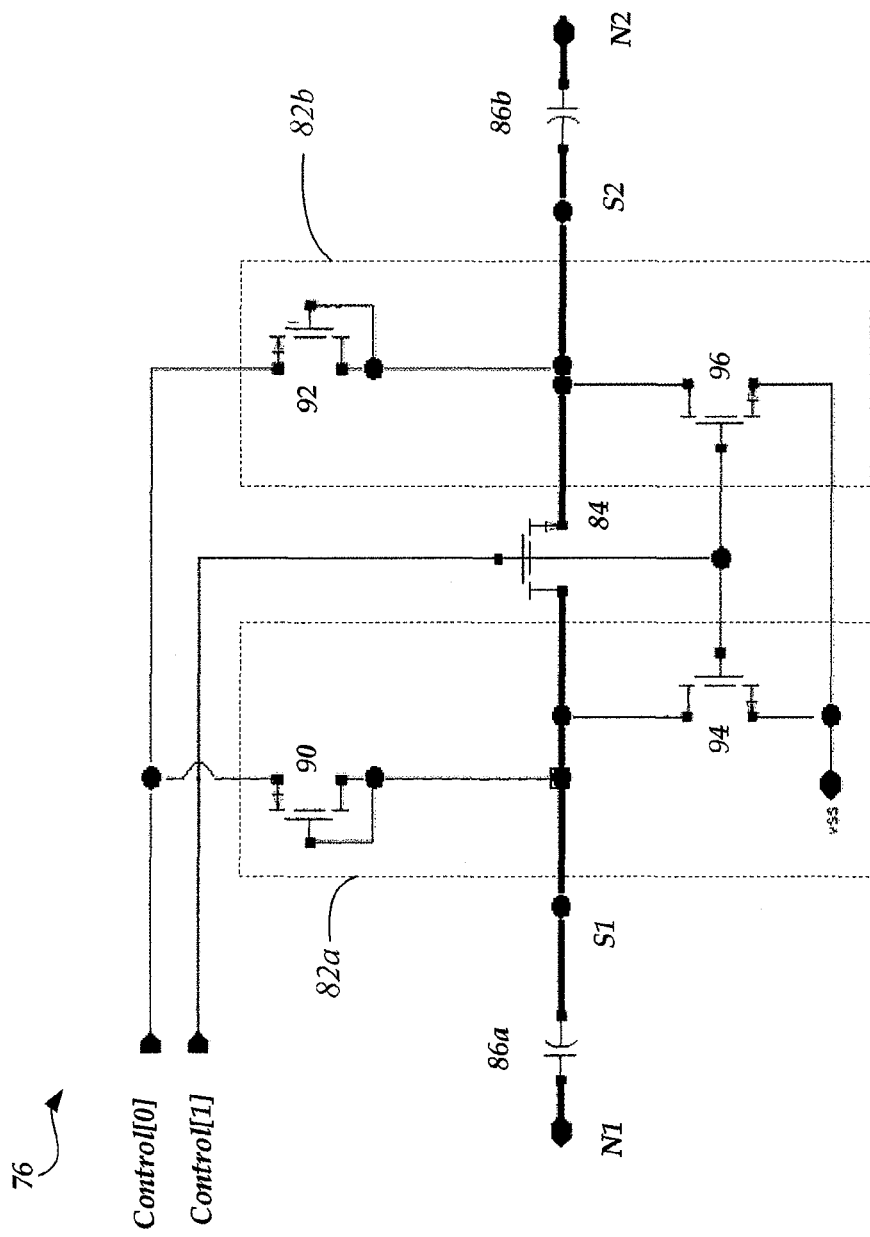
FIG. 9 is a schematic diagram of a switching circuit according to an embodiment.

FIG. 9 is a schematic diagram of a switching circuit 76 according to an embodiment. The switching circuit 76 illustrated in FIG. 9 is an example switching circuit 76a that can be implemented in one or more of the switching circuits 76a to 76n of the array 74 of switching circuits illustrated in FIG. 7. One switching circuit 76 can be included for each frequency band of an oscillator. In some implementations, 2, 4, 8, 16, 32, 64, 128 or more switching circuits 76 can be included in an array. The switching circuit 74 can include a first active circuit 82a, a second active circuit 82b, a switch 84, a first circuit element 86a, a second circuit element 86b, or any combination thereof.

The first active circuit 82a of FIG. 9 is one example of the first active circuit 82a of FIGS. 8A and/or 8B. Likewise, the second active circuit 82b of FIG. 9 is one example of the second active circuit 82b of FIGS. 8A and/or 8B. Any combination of features of the active circuits 82a and/or 82b described herein can be implemented in any other active circuits described herein.

Each of the active circuits illustrated in FIG. 9 include a pull-up transistor 90, 92 and a pull-down transistor 94, 96. The pull-up transistors 90, 92 can be field effect transistors, such as PMOS transistors. In some implementations, the pull-up transistor 90 and/or 92 can be diode connected, as shown in FIG. 9. The pull-up transistor 92 can receive a bias voltage Control[0], such as the intermediate node bias voltage described with reference to FIG. 7, and apply the bias voltage Control[0] to a node S1 between the drain of the switch 84 and a first end of the first circuit element 86a. Similarly, the pull-up transistor 92 can receive the bias voltage Control[0] and apply the bias voltage Control[0] to a node S2 between the source of the switch 84 and a first end of the second circuit element 86b.

When the switch 84 is off, the nodes S1 and/or S2 can be at a potential of about Vhigh-Vth, in which Vhigh can represent a logical high value and Vth can represent the threshold voltage of the pull-up transistors 90 and/or 92. The diode connected transistors 90 and/or 92 can operate in a saturation mode. In the saturation mode, the diode connected transistors 90 and 92 can provide a high DC impedance on nodes S1 and S2, respectively. In addition, the diode connected transistors 90 and 92 can each generate an impedance on the order of 100s of Mega Ohms at high frequencies (for example, RF frequencies). The diode connected transistors 90 and 92 do not add significant parasitic capacitance on nodes S1 and/or S2 or other nodes of the switching circuit 76. The diode connected transistors 90 and 92 can be configured to turn off when the switch 84 is on. For example, the bias voltage Control[1] can be the logical compliment of the voltage applied to the gate of the switch 84.

When the switch 84 is on, pull down transistors 94 and 96 can pull down nodes S1 and S2, respectively. In some implementations, the pull down transistors 94 and 96 can be controlled by the same signal applied to the gate of the switch 84. The pull down transistors 94 and 96 can be small in size relative to the switch 84. Consequently, the pull down transistors 94 and 96 may not add significant parasitic capacitance on nodes S1 and/or S2 or other nodes of the switching circuit 76.

The impedance generated by the active circuits 82a and 82b on nodes S1 and S2, respectively in combination with the parasitic capacitances at nodes S1 and S2 can form a noise filter with a relatively low corner frequency. Accordingly, the active circuits 82a and 82b can reduce noise in the switching circuit 76.

In the implementation illustrated in FIG. 9, the first circuit element 86a and the second circuit element 86b are differential capacitors. These capacitors can adjust the resonant frequency of a resonant circuit, such as an LC tank, for example, as described above.

Simulation results indicate that noise voltage spectral density of a capacitor switching circuit with resistors biasing source and drain of a switch 84 in the off-state can increase by 10 dB for every decade increase in impedance across source and drain of a field effect switch 84 when the switch 84 is off. A first-order low pass filter can be formed by the impedance across the source and drain of the field effect switch 84 and the parasitic capacitances formed by the gate and source of the switch 84, the gate and drain of the switch 84, and passive circuits, such as resistor networks, coupled to nodes S1 and/or S2. Thus, for every decade increase in impedance across source and drain of a field effect switch 84, there can also be a decade decrease in the first-order low-pass filtering of noise in the capacitor switching network in capacitor switching circuits with resistors biasing the source and drain of the switch 84. This can attenuate the noise contribution of the switch 84 in the off-state, particularly at high frequencies in the GHz range. Other simulation results indicate that impedance of circuits configured to bias nodes S1 and/or S2 can determine the low-pass noise filter corner frequency.

Figure 10A:
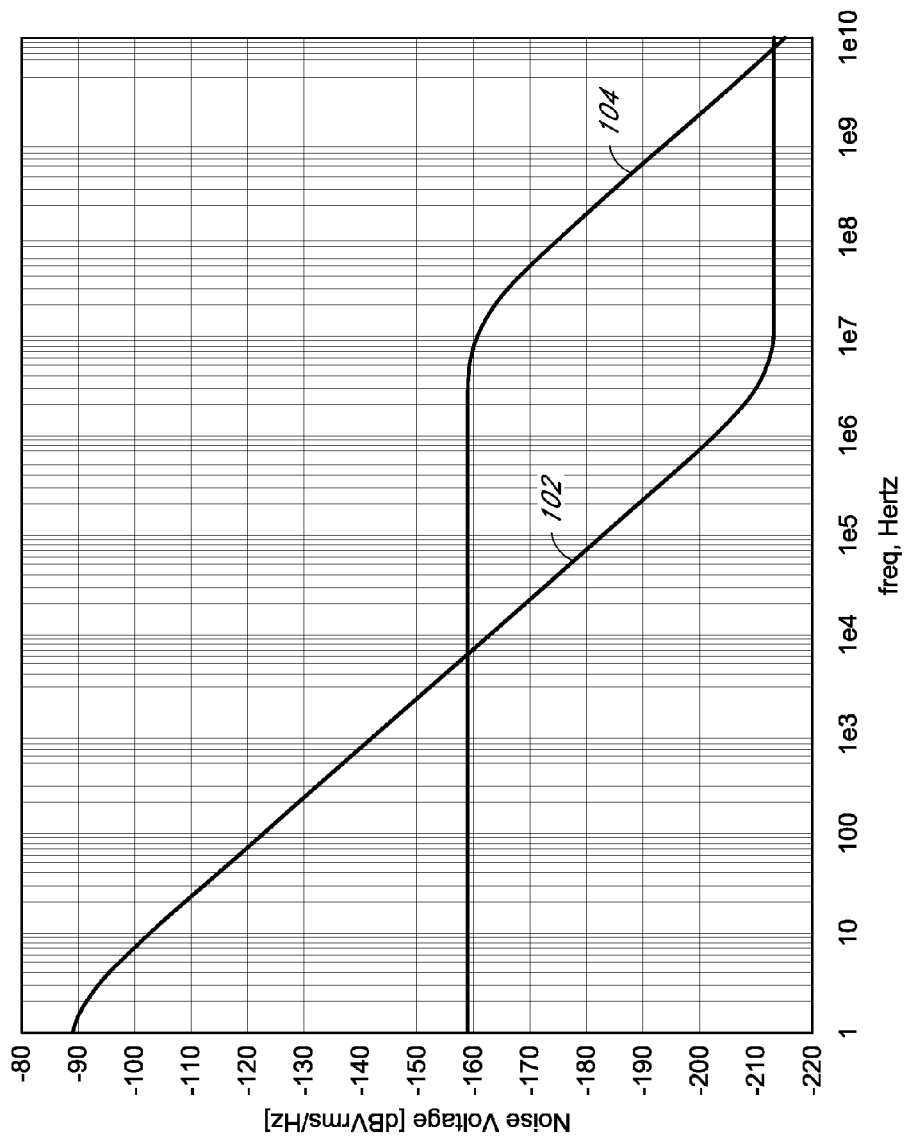
FIGS. 10A and 10B are graphs illustrating relationships among noise voltage spectral density in switching circuits showing a reduction in noise generated by a switching circuit according to an embodiment.
Figure 10B:
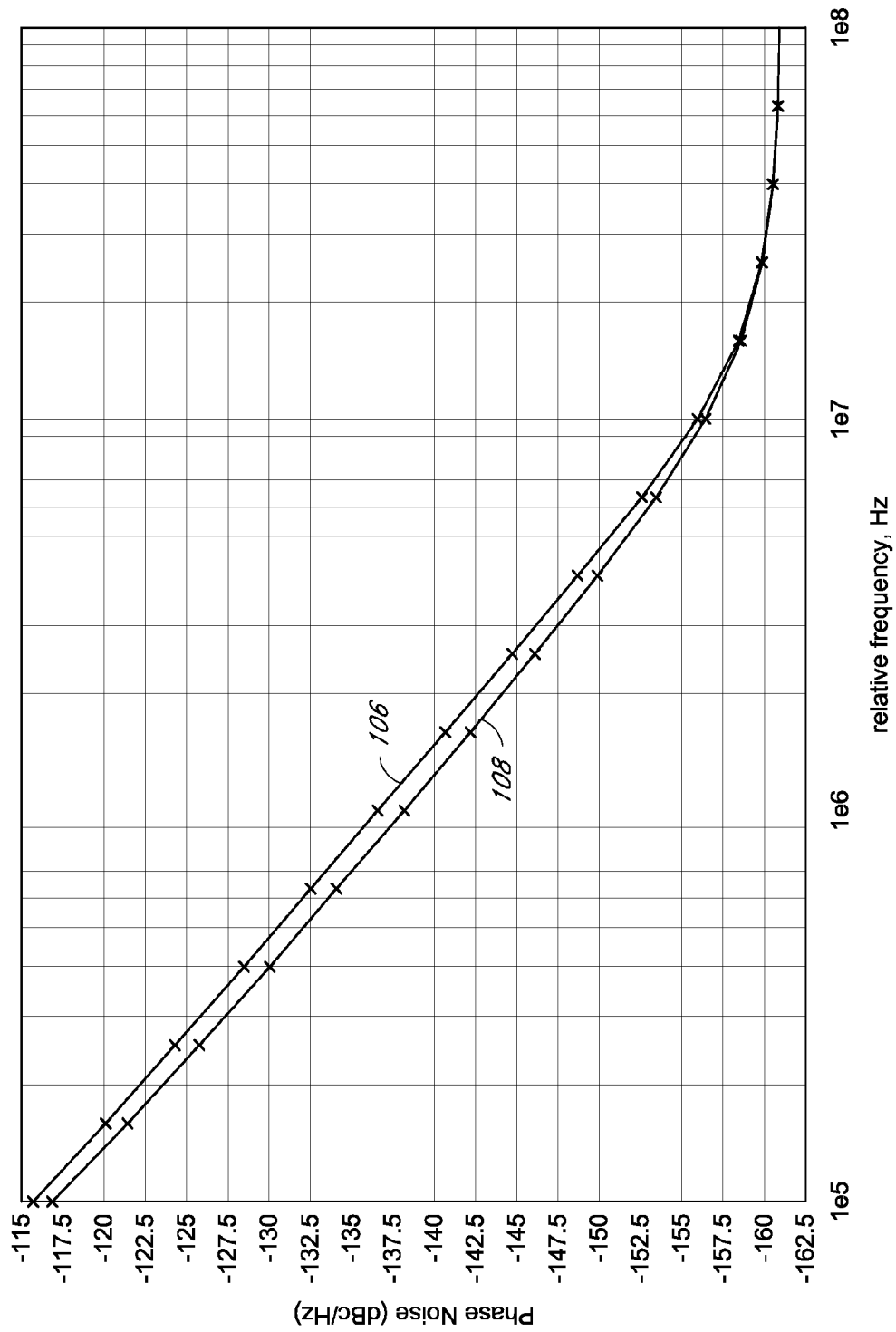

FIGS. 10A and 10B are graphs illustrating relationships among noise voltage spectral density in switching circuits showing a reduction in noise generated by a switching circuit, according to an embodiment. FIG. 10A shows a graph of the noise voltage spectral density of a capacitor switching network in the off-state (i.e., when the switch 84 is off) that compares active circuits and passive resistor-based circuits coupled to intermediate nodes S1 and S2. Curve 102 represents the noise voltage spectral density of a switching circuit with active circuits, which are functionally similar to the active circuits 82a and 82b, of FIG. 9 coupled to nodes S1 and S2, respectively. In contrast, curve 104 represents the noise voltage spectral density of a switching circuit passive resistor-based circuits configured to bias nodes S1 and S2, with the resistive circuits having an impedance of about 30 k Ohm from source to drain of a field effect switch 84. FIG. 10A shows that AC noise voltage spectral density is reduced by about 9 dB at 3 GHz in the curve 102 compared to the curve 104.

FIG. 10B shows graph comparing phase noise of a resistor pull-up/pull down network and a PMOS switch based network in a switching circuit. Curve 106 represents phase noise of a first VCO that includes a passive resistor-based circuit configured to bias intermediate nodes S1 and S2 of a band-switch circuit. Curve 108 represents phase noise of a second VCO that includes a PMOS-based circuit configured to bias intermediate nodes S1 and S2 of a band-switch circuit. Table 4 summarizes data from the curves 106 and 108 in the graph of FIG. 10B. The data indicate that performance parameters, such as the fundamental frequency, current consumption and amplitude are roughly the same for the first VCO and the second VCO. The data indicate that phase noise of the first VCO and the second VCO is roughly the same when all the band-switches are switched in across an LC tank (i.e., at the lowest fundamental frequency) as expected, since the phase noise appears to be dominated by the on resistance of the band-switch. However, the data in Table 4 indicate improvements in phase noise of the second VCO compared to the first VCO of about a 1.5 dB at frequency offsets of about 0.4 MHz to 2 MHz and about a 1 dB improvement in phase noise at low frequency offsets of about 100 kHz. The 1.5 dB improvement in phase noise can result from eliminating the contribution of the pull-up resistors in the band-switches to the total phase noise, when the band-switch is off. The contributions to phase noise listed in Table 4 indicate that the contribution of the pull-up resistors in the band-switches in the first VCO to the total phase noise is about 29%.

TABLE 4

|  | R-Based (Highest Band) | R-Based (Lowest Band) | Active (Highest Band) | Active (Lowest Band) |
| --- | --- | --- | --- | --- |
| VCO Fundamental Frequency | 3.80 GHz | 3.22 GHz | 3.78 GHz | 3.22 GHz |
| VCO Core Current Consumption | 19.59 mA | 30.40 mA | 19.61 mA | 30.55 mA |

TABLE 4-continued

|  | R-Based (Highest Band) | R-Based (Lowest Band) | Active (Highest Band) | Active (Lowest Band) |
|---|---|---|---|---|
| VCO Core RMS Voltage | 3.33 V | 3.81 V | 3.31 V | 3.78 V |
| Total phase noise (dBc/Hz) at | | | | |
| 0.1 MHz | −115.74 | −119.82 | −116.91 | −119.44 |
| 1 MHz | −136.57 | −140.45 | −138.15 | −140.41 |
| 10 MHz | −155.95 | −158.10 | −156.41 | −157.94 |
| 100 MHz | −160.93 | −159.75 | −160.92 | −161.38 |
| Phase Noise Power from Pull-Up Devices (%) | 28.89 | | Negligible | |
| Phase Noise Power from Sustaining amplifier (%) | 47.08 | | 74.04 | |
| Phase Noise Power from inductor (%) | 12.46 | | 18.31 | |

Figure 11A:
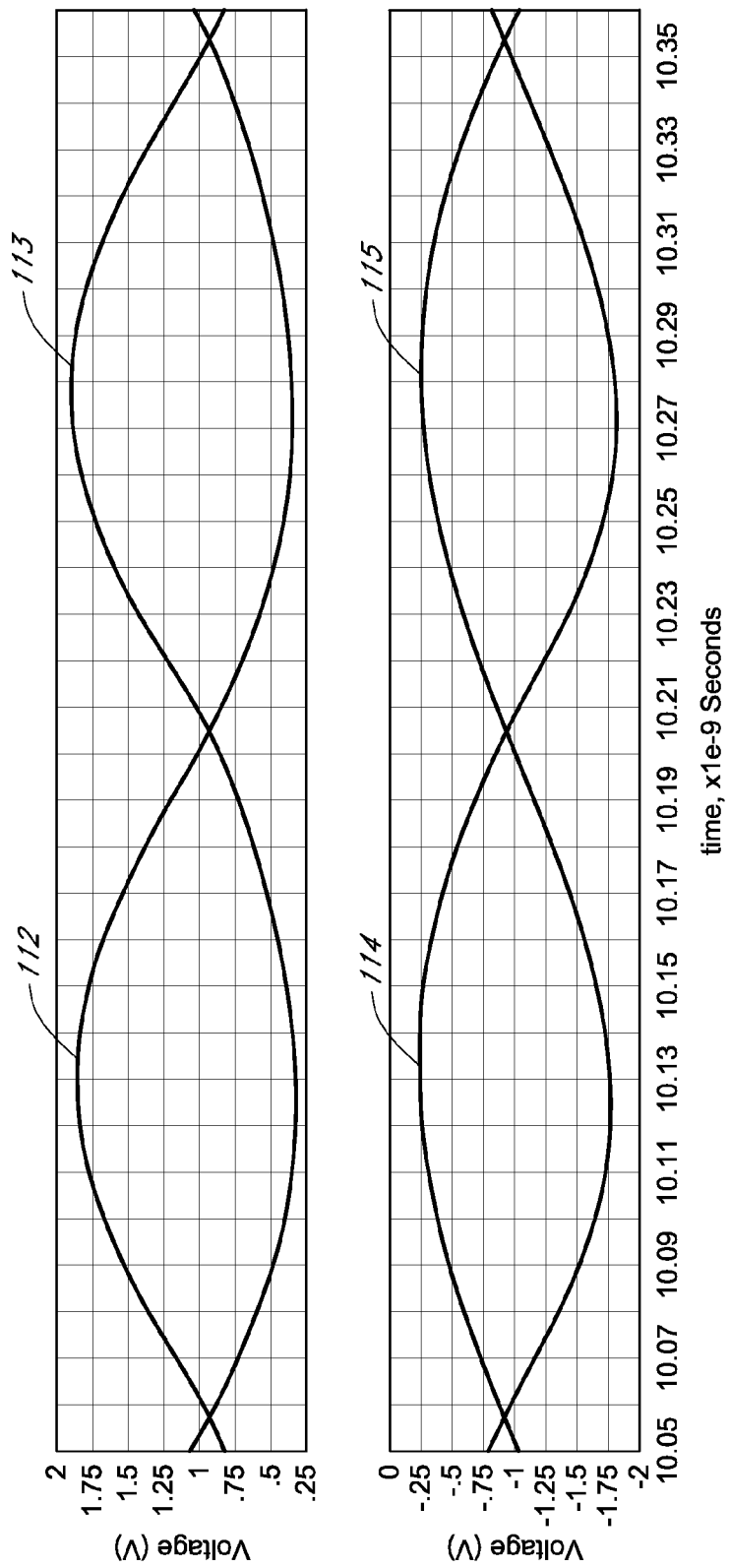
FIGS. 11A and 11B are graphs illustrating voltage swings in switching circuits showing that voltage swings stay within a desired range of breakdown voltages according to an embodiment.
Figure 11B:
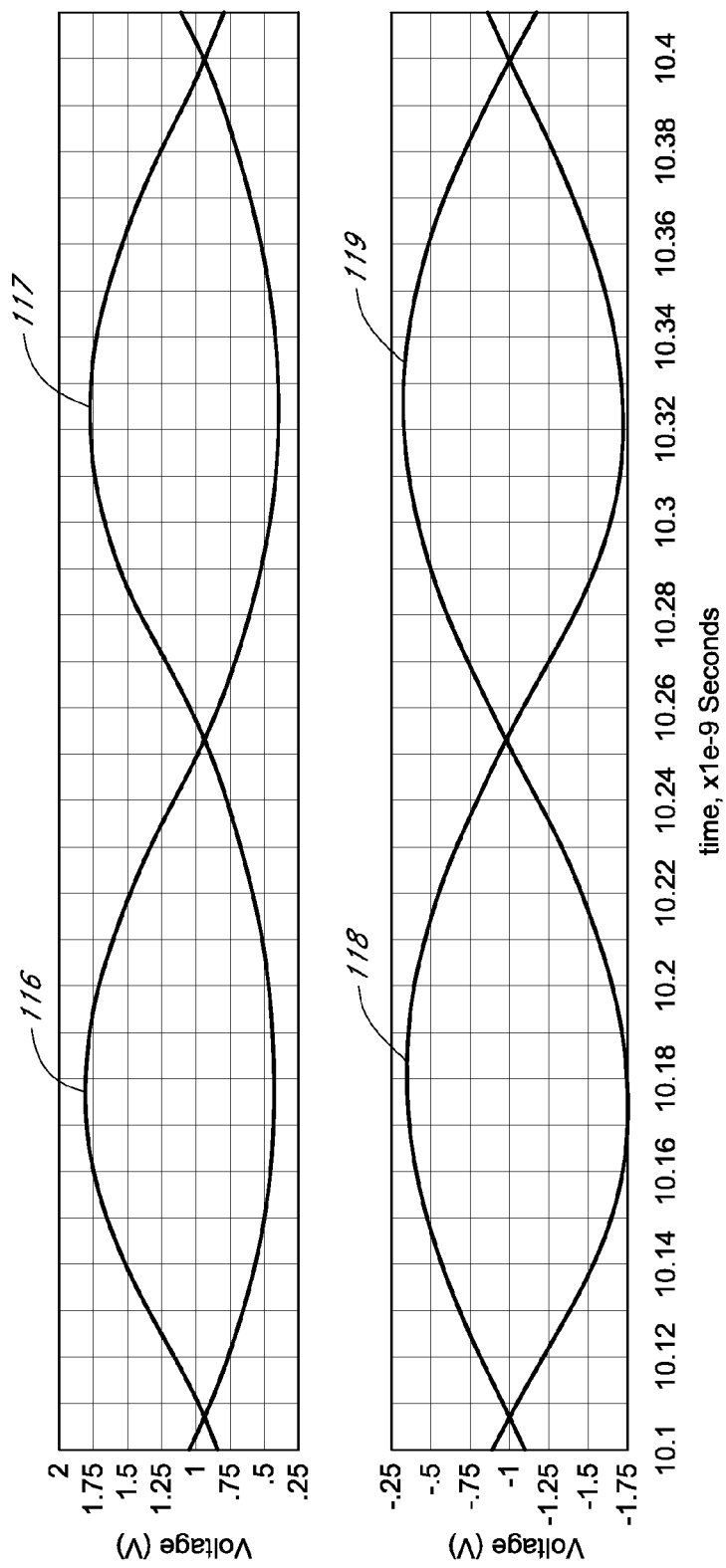

FIGS. 11A and 11B are graphs illustrating voltage swings in switching circuits showing that voltage swings stay within a desired range of breakdown voltages according to an embodiment. The simulation switching circuits are functionally similar to the active circuits 82a, 82c of FIG. 9. In FIG. 11A, curve 112 in a time domain waveform of voltage at the source of the switch 84 of FIG. 9 and curve 113 is a time domain waveform of voltage at the drain of the switch 84 of FIG. 9. The gate-to-source voltage is represented by curve 114 and the gate-to-drain voltage is represented by the curve 115. FIG. 11A corresponds to high bias/maximum bias conditions. Similar results were observed across the range of frequency bands for the VCO.

FIG. 11B shows simulation results from the same simulation corresponding to FIG. 11A, except that FIG. 11B includes data from low/minimum bias conditions. In FIG. 11B, curve 116 in a time domain waveform of voltage at the source of the switch 84 of FIG. 9 and curve 117 is a time domain waveform of voltage at the drain of the switch 84 of FIG. 9. The gate-to-source voltage is represented by curve 118 and the gate-to-drain voltage is represented by the curve 119. FIG. 11A corresponds to high bias/maximum bias conditions. Similar results were observed across the range of frequency bands for the VCO.

The curves shown in FIGS. 11A and 11B indicate that the voltage swings should not exceed the rated breakdown voltages at any of the junctions by more than 10%. This is within acceptable bounds.

Other data indicate that a capacitor switching with active circuits 82a and 82b (for example, as shown in FIG. 9) and the passive impedance network 20c (for example, as shown in FIG. 4) can lead to about 5 dB improvement in phase noise of a VCO. The active circuits 82a and 82b can improve phase noise by about 2.5 dB according to other data. The passive impedance network 20c can improve phase noise in the sustaining amplifier by about 3 dB according to the other data.

With one or more of the improvements in phase noise described herein, VCOs can meet challenging noise requirements. For instance, simulation results indicate that VCOs manufactured with a SiCMOS process with one or more features described herein can meet the Multi-Carrier GSM TX 1800 noise specification.

Table 5 shows some of the phase noise data for an oscillator with a passive impedance network 20c of FIG. 4 and switching circuits 76 of FIG. 9. The data in Table 5 indicate that the phase noise of an enhanced VCO with the passive impedance network 20c and switching circuits 76 can improve phase noise by about 2.6 dB compared to some conventional VCOs. The enhanced VCO can have about −137.1 dBc/Hz phase noise at 1 MHz offset from a 3.3 GHz RF carrier.

TABLE 5

| Core | Enhanced VCO | Conventional VCO |
|---|---|---|
| Phase Noise at 1 MHz (dBc/Hz) Vtune = 1.5 V, Vdd = 2.7 V | Highest Band: −134.7 (VCO Bias = 32) Lowest Band: −137.1 (VCO Bias = 32) | Highest Band: −132.2 (VCO Bias = 3) Lowest Band: −135 (VCO Bias = 3) |
| Tuning Range (MHz) | 3682-3284 (398, 12%) | 3613-3172 (441, 13.9%) |
| Correction Factor with respect to Center Frequency (dB) | Highest Band: 0 Lowest Band: 0 | +0.16 +0.3 |
| Effective Phase Noise degradation with respect to enhanced VCO (dB) | Highest Band: 0 Lowest Band: 0 | +2.66 +2.40 |

Reducing Noise Generated by Sustaining Amplifier and Switching Network

In some embodiments, oscillators can be configured to reduce the noise generated by a sustaining amplifier and noise generated by the switching network. Any combination of features described with reference to FIG. 3A, 3B, or 4 can be implemented in concert with any combination of features described with reference to FIG. 7, 8A, 8B, or 9.

For example, an oscillator can include a resonant circuit, a sustaining amplifier, a passive impedance network, and a switching network. The resonant circuit can have a first end and a second end. In some implementations, the first end and the second end are a non-inverted node and an inverted node, respectively. The sustaining amplifier can include a first switch configured to drive the first end of the resonant circuit in response to an input at a first control terminal of the first switch and a second switch configured to drive the second end of the resonant circuit in response to an input at a second control terminal of the second switch. The passive impedance network can include one or more explicit passive impedance elements. The passive impedance network can be configured to pass a bias to the first control terminal of the first switch and the second control terminal of the second switch. The switching network can include one or more switching circuits that are configured to tune a resonant frequency of the resonant circuit. Each of one or more switching circuits can include a circuit element, a switch, and an active circuit. The circuit element can have at least a first end and a second end. In some implementations, the circuit element can be a capacitor. The switch can be configured to selectively couple the second end of the circuit element to the second end of the resonant circuit. The active circuit can be configured to assert a high impedance on an intermediate node between the switch and the first node when the switch is off. For instance, the high impedance can be asserted in response to the switch turning off. In some implementations, the intermediate node is between the switch and the second end on the circuit element. The passive impedance network can effectively be in parallel with the resonant circuit. Accordingly, the passive impedance network and the circuit element of the switching circuit can both contribute to setting the resonant frequency of the resonant circuit. For instance, the inductance and/or capacitance of the passive impedance network combined with a capacitance of a capacitor of one or more switching circuit coupled in parallel with the resonant circuit can contribute to setting the resonant frequency.

CONCLUSION

In the embodiments described above, some methods, systems, and/or were described in conjunction with particular embodiments, such as an LC tank. A skilled artisan will, however, appreciate that the principles and advantages of the embodiments can be used for any other systems, apparatus, or methods with a need for a low noise oscillator. Some example systems with a need for a low noise oscillator include wired and wireless communications transceivers, clock and data recovery circuits for fiber optic cables, SerDes interfaces, and the like.

Such methods, systems, and/or apparatus can be implemented into various electronic devices. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. As used herein, "active circuit elements" generally refer to circuit elements that are capable of delivering energy, and "passive circuit elements" generally refer to circuit elements that are configured to receive and/or dissipate/store energy. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An apparatus comprising:
   a resonant circuit having a first terminal and a second terminal, the resonant circuit configured to operate at a resonant frequency;
   a sustaining amplifier comprising a first switch configured to drive the first terminal of the resonant circuit in response to an input at a first control terminal of the first switch, and a second switch configured to drive the second terminal of the resonant circuit in response to an input at a second control terminal of the second switch, wherein the first switch and the second switch are of the same conductivity type; and
   a passive impedance network comprising a first inductor and a second inductor, the first inductor being separate from the second inductor, the passive impedance network electrically coupled to the first and second terminals of the resonant circuit, wherein the first inductor is configured to pass a first bias to the first control terminal of the first switch and the second inductor is configured to pass a second bias to the second control terminal of the second switch.

2. The apparatus of claim 1, wherein the passive impedance network is configured to reduce an amount of time that the first switch drives the first terminal of the resonant circuit while the second switch drives the second terminal of the resonant circuit.

3. The apparatus of claim 1, wherein the passive impedance network comprises a first capacitor configured to block a direct current (DC) bias from the second terminal of the resonant circuit to the first control terminal of the first switch.

4. The apparatus of claim 3, wherein the passive impedance network further comprises a second capacitor configured to block an other DC bias from the first terminal of the resonant circuit to the second control terminal.

5. The apparatus of claim 1, wherein the passive impedance network is configured to provide a high impedance radio frequency (RF) inductance at a resonant frequency of the resonant circuit.

6. The apparatus of claim 1, wherein the first switch comprises a field effect transistor, and wherein the field effect transistor is biased such that an amount of time that the transistor operates in the Ohmic region is reduced.

7. The apparatus of claim 1, wherein the first control terminal is coupled to the second terminal of the resonant circuit, and wherein the second control terminal is coupled to the first terminal of the resonant circuit.

8. The apparatus of claim 1, wherein the resonant circuit comprises an LC circuit.

9. The apparatus of claim 1, wherein the first switch comprises a field effect transistor, and wherein the first control terminal is the gate of the field effect transistor.

10. The apparatus of claim 1, wherein the first bias and the second bias are different.

11. The apparatus of claim 1, further comprising a tail inductor coupled to at least one of the first switch or the second switch of the sustaining amplifier, wherein the tail inductor is configured to provide a bias current to the sustaining amplifier.

12. A method of reducing phase noise in an oscillator having a resonant circuit with an inverted node and a non-inverted node, the method comprising:
blocking a DC bias to a first gate of a first transistor of a sustaining amplifier via a passive impedance network, the passive impedance network comprising one or more explicit passive impedance elements, and the first transistor configured to drive the non-inverted node of the resonant circuit of the oscillator;
biasing the first gate of the first transistor with a first bias signal via an inductor of the passive impedance network;
biasing a second gate of a second transistor of the sustaining amplifier with a second biasing signal via a second inductor, wherein the second transistor is configured to drive the inverted node of the resonant circuit of the oscillator, wherein the first bias signal is different than the second bias signal, and wherein the first transistor and the second transistor are of the same conductivity type.

13. The method of claim 12, further comprising:
blocking an other DC bias to the second gate of the second transistor via the passive impedance network.

14. The method of claim 12, further comprising to providing a high impedance RF inductance at a resonant frequency of the resonant circuit via the passive impedance network.

15. The method of claim 12, wherein the resonant circuit comprises an LC tank.

16. The method of claim 12, wherein the passive impedance network comprises a capacitor having a first end and a second end, the first end coupled to the first gate and the second end coupled to the inverted node.

17. An apparatus comprising:
a resonant circuit having a first end and a second end;
a sustaining amplifier comprising a first switch configured to drive the first end of the resonant circuit in response to an input at a first control terminal of the first switch, and a second switch configured to drive the second end of the resonant circuit in response to an input at a second control terminal of the second switch, wherein the first switch and the second switch are cross coupled; and
a passive impedance network comprising one or more explicit passive impedance elements, the one or more explicit passive impedance elements comprising at least one inductor, the passive impedance network electrically coupled to the first and second ends of the resonant circuit, and the passive impedance network configured to: resonate with a capacitance associated with the sustaining amplifier, and bias the first control terminal and the second control terminal with different bias signals.

18. The apparatus of claim 17, wherein the passive impedance network is configured to resonate with the capacitance associated with the sustaining amplifier so as to increase the tenability of the resonant circuit.

19. The apparatus of claim 17, wherein the apparatus comprises an oscillator, wherein the passive impedance network is configured to resonate with the capacitance associated with the sustaining amplifier so as to reduce phase noise of the oscillator.

20. The apparatus of claim 17, wherein the passive impedance network is configured to resonate with the capacitance associated with the sustaining amplifier so as to reduce a conduction angle of the sustaining amplifier.

21. The apparatus of claim 17, wherein the capacitance associated with the sustaining amplifier is a parasitic capacitance of the sustaining amplifier.

* * * * *